(12) United States Patent
Ahn et al.

(10) Patent No.: US 12,448,564 B2
(45) Date of Patent: Oct. 21, 2025

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: HeeChoon Ahn, Seoul (KR); Soo-Byung Ko, Yongin-si (KR); Hyeongmin Kim, Suwon-si (KR); Hyunah Um, Seoul (KR); Yeseul Lee, Busan (KR); Yirang Im, Daejeon (KR)

(73) Assignee: Samsung Display Co., Ltd., Yongin-si (KR)

( * ) Notice: Subject to any disclaimer, the term of this patent is extended or adjusted under 35 U.S.C. 154(b) by 1280 days.

(21) Appl. No.: 16/780,744

(22) Filed: Feb. 3, 2020

(65) Prior Publication Data

US 2020/0328352 A1 Oct. 15, 2020

(30) Foreign Application Priority Data

Apr. 12, 2019 (KR) .................. 10-2019-0042995

(51) Int. Cl.
| | | |
|---|---|---|
| *H01L 51/54* | (2006.01) | |
| *C07F 5/02* | (2006.01) | |
| *C09K 11/06* | (2006.01) | |
| *H10K 85/30* | (2023.01) | |
| *H10K 85/60* | (2023.01) | |
| *H10K 50/11* | (2023.01) | |
| *H10K 50/15* | (2023.01) | |
| *H10K 50/16* | (2023.01) | |
| *H10K 101/10* | (2023.01) | |

(52) U.S. Cl.
CPC .............. *C09K 11/06* (2013.01); *C07F 5/027* (2013.01); *H10K 85/322* (2023.02); *H10K 85/658* (2023.02); *C09K 2211/1018* (2013.01); *H10K 50/11* (2023.02); *H10K 50/15* (2023.02); *H10K 50/16* (2023.02); *H10K 2101/10* (2023.02)

(58) Field of Classification Search
None
See application file for complete search history.

(56) References Cited

U.S. PATENT DOCUMENTS

| | | |
|---|---|---|
| 6,602,618 B2 | 8/2003 | Watanabe et al. |
| 10,374,166 B2 | 8/2019 | Hatakeyama et al. |
| 10,483,471 B2 | 11/2019 | Ishidai et al. |
| 10,804,482 B2 | 10/2020 | Sakamoto |
| 2004/0170863 A1 | 9/2004 | Kim et al. |
| 2007/0059552 A1 | 3/2007 | Takeda et al. |
| 2012/0319091 A1 | 12/2012 | Kato |
| 2014/0034926 A1* | 2/2014 | Matsubara ............. H10K 50/13 |
| | | 257/40 |
| 2015/0236274 A1 | 8/2015 | Hatakeyama et al. |
| 2016/0351811 A1* | 12/2016 | Lam ..................... H10K 85/322 |
| 2018/0069182 A1 | 3/2018 | Hatakeyama et al. |
| 2018/0094000 A1 | 4/2018 | Hatakeyama et al. |
| 2018/0108857 A1 | 4/2018 | Adachi et al. |
| 2018/0301629 A1 | 10/2018 | Hatakeyama et al. |
| 2019/0058124 A1 | 2/2019 | Hatakeyama et al. |
| 2019/0115538 A1 | 4/2019 | Lim et al. |
| 2019/0207112 A1* | 7/2019 | Hatakeyama ........ C07D 209/80 |
| 2019/0348617 A1 | 11/2019 | Mamada et al. |
| 2021/0159411 A1 | 5/2021 | Sim et al. |
| 2021/0273174 A1 | 9/2021 | Kuwabara et al. |
| 2021/0305512 A1 | 9/2021 | Suzaki |
| 2021/0376250 A1 | 12/2021 | Suzaki |

FOREIGN PATENT DOCUMENTS

| | | |
|---|---|---|
| CA | 3017002 A1 | 3/2019 |
| CH | 422200 A | 10/1966 |
| CN | 107417715 A | 12/2017 |
| JP | 2007-73891 A | 3/2007 |
| JP | 2012-116784 A | 6/2012 |
| JP | 5935199 B2 | 6/2016 |
| JP | WO2017/138526 A1 | 8/2017 |
| JP | 2018043984 A2 | 3/2018 |
| KR | 10-1516062 B1 | 4/2015 |
| KR | 10-1523124 B1 | 5/2015 |
| KR | 10-2016-0119683 A | 10/2016 |
| KR | 10-2017-0082447 A | 7/2017 |
| KR | 10-2017-0130434 A | 11/2017 |
| KR | 10-2017-0130435 A | 11/2017 |
| KR | 10-1876763 B1 | 7/2018 |
| KR | 10-1886773 B1 | 8/2018 |
| KR | 10-2018-0108604 A | 10/2018 |

(Continued)

OTHER PUBLICATIONS

Agou, et al., "Electronic and Optical Properties of Ladder-type Heteraborins," Chem. Eur. J. (2007), pp. 8051-8060.

Colquhoun, et al., "Synthesis of Dixanthones and Poly(dixanthone)s by Cyclization of 2-Aryloxybenzonitriles in Trifluoromethanesulfonic Acid," Org Lett. (2001), vol. 3, No. 15, pp. 2337-2340.

Office Action dated Nov. 30, 2023 for U.S. Appl. No. 16/523,168, 7 pages.

Agou, T., et al. "Syntheses, Structure, and Optical Properties of Ladder-Type Fused Azaborines," Organic Letters 8(11), 2006, pp. 2241-2244.

(Continued)

*Primary Examiner* — Andrew K Bohaty

(74) *Attorney, Agent, or Firm* — Womble Bond Dickinson (US) LLP

(57) ABSTRACT

An organic electroluminescence device having high luminous efficiency includes: a first electrode, a hole transport region on the first electrode, an emission layer on the hole transport region, an electron transport region on the emission layer, and a second electrode on the electron transport region, wherein the emission layer includes a polycyclic compound represented by Formula 1 to achieve high luminous efficiency.

19 Claims, 2 Drawing Sheets

(56) References Cited

FOREIGN PATENT DOCUMENTS

| KR | 10-2018-0122298 | A | | 11/2018 | | |
|---|---|---|---|---|---|---|
| KR | 2018-0134850 | A | | 12/2018 | | |
| KR | 10-2019-0025065 | | | 3/2019 | | |
| KR | 10-1955647 | B1 | | 3/2019 | | |
| KR | 10-1955648 | B1 | | 3/2019 | | |
| KR | 10-2019-0042791 | A | | 4/2019 | | |
| KR | 2019-0035990 | A | | 4/2019 | | |
| WO | WO 2015/102118 | A1 | | 7/2015 | | |
| WO | WO 2016/152418 | A1 | | 9/2016 | | |
| WO | WO 2016/152544 | A1 | | 9/2016 | | |
| WO | WO 2016/152605 | A1 | | 9/2016 | | |
| WO | WO-2017188111 | A1 | * | 11/2017 | .......... | C07D 209/80 |
| WO | WO 2018/212169 | A1 | | 11/2018 | | |
| WO | WO 2019/052940 | A1 | | 3/2019 | | |
| WO | WO 2021/230133 | A1 | | 11/2021 | | |
| WO | WO 2022/096495 | A1 | | 5/2022 | | |

OTHER PUBLICATIONS

Chinese Office Action dated Mar. 17, 2023 for CN Appl. No. 201910694080.8, 11 pages.
Office Action for U.S. Appl. No. 16/523,168 dated Feb. 16, 2023, 10 pages.
Office Action for U.S. Appl. No. 17/002,617 dated Mar. 17, 2023, 6 pages. .
Zhang, J., et al. "The Ground State Spin Multiplicity of Schlenk-type Biradicals and the Influence of Additional Linkage to Ladder Type Structures" Chemical Physics 206, 1996, pp. 339-351.
WO-2021230133-A1 machine translation (Year: 2021).
US Office Action dated May 17, 2023, issued in U.S. Appl. No. 17/110,108 (35 pages).
US Final Office Action dated Jul. 7, 2023, issued in U.S. Appl. No. 16/523,168 (10 pages).
US Advisory Action dated May 31, 2022, issued in U.S. Appl. No. 16/523,168 (3 pages).
US Notice of Allowance dated Jul. 19, 2023, issued in U.S. Appl. No. 17/002,617 (8 pages).
Anton Pershin, et al., "Highly emissive excitons with reduced exchange energy in thermally activated delayed fluorescent molecules," Nature Communications, vol. 10, No. 597, (2019), pp. 1-5.
Chibani et al., "Excited States of Ladder-Type TT-Conjugated Dyes with a Joint SOS-CIS(D) and PCM-TD-OFT Approach," J. Phys. Chem. A. 119—pp. 5417-5425. 2015 (Year: 2015).
Wang et al., "Synthesis of Di- and Trixanthones that Display High Stability and a Visual Fluorescence Response to Strong Acid," Chem. Asian J. 9—pp. 3307-3312. 2014 (Year: 2014).
US Office Action dated Dec. 21, 2021, issued in U.S. Appl. No. 16/523,168 (25 pages).
Notice of Allowance for U.S. Appl. No. 17/110,108 dated Dec. 22, 2023, 10 pages.
Final Office Action for U.S. Appl. No. 16/523,168 dated Mar. 28, 2022, 24 pages.
Restriction Requirement for U.S. Appl. No. 16/523,168 dated Aug. 16, 2021, 8 pages.
Final Office Action for U.S. Appl. No. 16/523,168 dated Mar. 7, 2024, 7 pages.
US Office Action dated Jul. 12, 2024, issued in U.S. Appl. No. 16/523,168 (8 pages).
Korean Notice of Allowance dated Nov. 27, 2024, issued in corresponding Korean Patent Application No. 10-2019-0042995 (7 pages).

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0042995, filed on Apr. 12, 2019, the entire content of which is incorporated herein by reference.

BACKGROUND

Embodiments of the present disclosure herein relate to an organic electroluminescence device and a polycyclic compound used for the same.

Recently, the development of an organic electroluminescence display device as an image display device has been actively conducted. Unlike a liquid crystal display device, an organic electroluminescence display device is a self-luminescent display device in which holes and electrons injected from a first electrode and a second electrode are recombined in an emission layer, and a light emission material, which is an organic compound included in the emission layer, emits light to realize a display.

In the application of an organic electroluminescence device to a display device, the organic electroluminescence device should have a low driving voltage, high luminous efficiency and a long life-time, and accordingly development of materials for an organic electroluminescence device capable of stably realizing these features is being conducted.

For example, to realize an organic electroluminescence device having high efficiency, in recent years, technology regarding phosphorescence emission using a triplet state energy or delayed fluorescence emission using triplet-triplet annihilation (TTA), which is a phenomenon of generating a singlet exciton by collision of a triplet exciton excitation, has been developed, and development of a thermally activated delayed fluorescence (TADF) material using the delayed fluorescence phenomenon is actively being conducted.

SUMMARY

Embodiments of the present disclosure provide an organic electroluminescence device having a long life-time and high efficiency, and a polycyclic compound used therefor.

Embodiments of the present disclosure also provide an organic electroluminescence device including a thermally activated delayed fluorescence emission material and a polycyclic compound used as a thermally activated delayed fluorescence emission material.

An embodiment of the present disclosure provides an organic electroluminescence device including: a first electrode; a hole transport region on the first electrode; an emission layer on the hole transport region; an electron transport region on the emission layer; and a second electrode on the electron transport region, wherein the first electrode and the second electrode each independently include at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof, and wherein the emission layer includes a polycyclic compound represented by Formula 1 below:

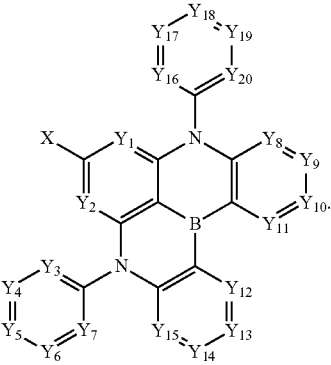

Formula 1

In Formula 1, X may be a substituted or unsubstituted amine group, a substituted or unsubstituted alkyl group having 1 to 10 carbon atoms, a substituted or unsubstituted cycloalkyl group having 5 to 30 ring-forming carbon atoms, a substituted or unsubstituted heterocycloalkyl group having 2 to 30 ring-forming carbon atoms, a substituted or unsubstituted aryl group having 6 to 30 ring-forming carbon atoms, or a substituted or unsubstituted heteroaryl group having 2 to 30 ring-forming carbon atoms; and $Y_1$ to $Y_{20}$ may each independently be $CR_1$ or N, wherein at least one selected from $Y_1$ to $Y_{20}$ may be N, and $R_1$ may be a hydrogen atom, a deuterium atom, a halogen atom, a boron group, a nitrile group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In an embodiment, the emission layer may emit delayed fluorescence.

In an embodiment, the emission layer may be a delayed fluorescence emission layer including a host and a dopant, and the dopant may include the polycyclic compound.

In an embodiment, the emission layer may be a thermally activated delayed fluorescence emission layer emitting blue light.

In an embodiment, at least one selected from $Y_1$ to $Y_{15}$ may be N.

In an embodiment, Formula 1 may be represented by any one selected from Formulae 2-1 to 2-3 below:

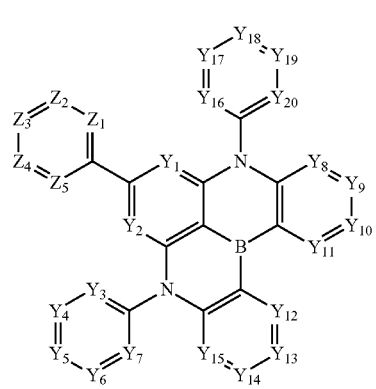

Formula 2-1

-continued

Formula 2-2

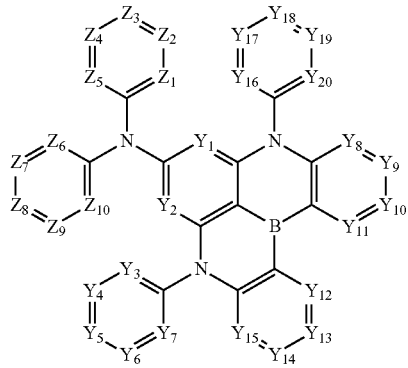

Formula 2-3

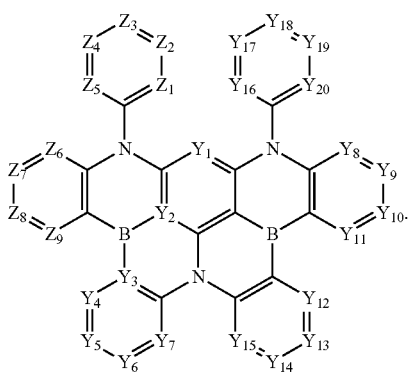

In Formulae 2-1 to 2-3, $Z_1$ to $Z_{10}$ may each independently be N or $CR_2$, wherein $R_2$ may be a hydrogen atom, a deuterium atom, a halogen atom, a boron group, a nitrile group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and $Y_1$ to $Y_{20}$ are the same as defined with respect to Formula 1.

In Formulae 2-1 and 2-2, at least one selected from $Y_1$ and $Y_2$ may be N.

In Formula 2-3, $Y_1$ may be N.

In an embodiment, Formula 2-1 may be represented by Formula 3-1 or 3-2 below:

Formula 3-1

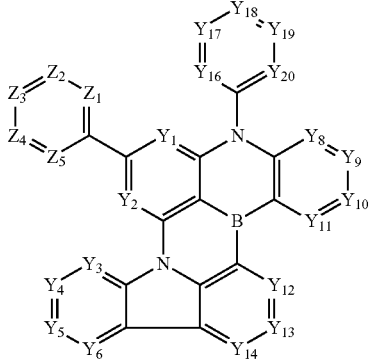

Formula 3-2

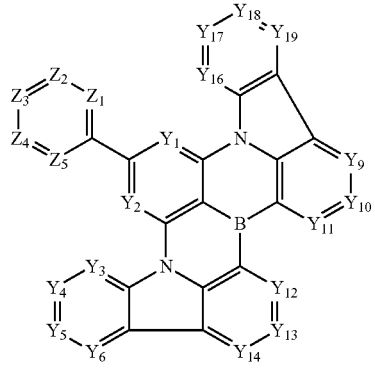

In Formulae 3-1 and 3-2, $Y_1$ to $Y_6$, $Y_8$ to $Y_{14}$, $Y_{16}$ to $Y_{20}$, and $Z_1$ to $Z_5$ are the same as defined with respect to Formula 2-1.

In an embodiment, Formula 2-1 may be represented by Formula 4 below:

Formula 4

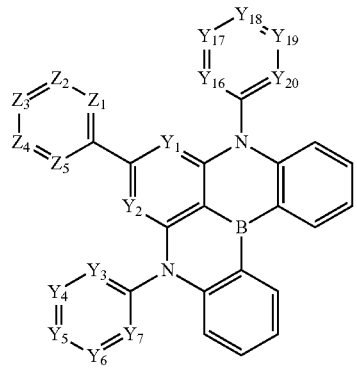

In Formula 4, $Y_1$ to $Y_7$, $Y_{16}$ to $Y_{20}$, and $Z_1$ to $Z_5$ are the same as defined with respect to Formula 2-1.

In an embodiment, Formula 2-2 may be represented by Formula 5 below:

Formula 5

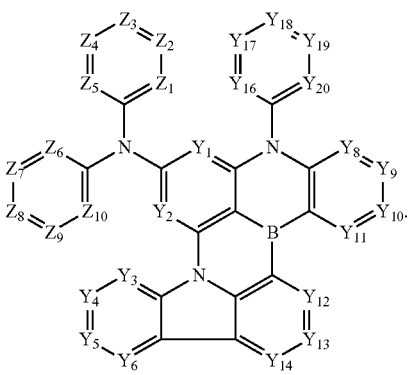

In Formula 5, $Y_1$ to $Y_6$, $Y_8$ to $Y_{14}$, $Y_{16}$ to $Y_{20}$, and $Z_1$ to $Z_{10}$ are the same as defined with respect to Formula 2-2.

In an embodiment, Formula 2-3 may be represented by Formula 6 below:

Formula 6

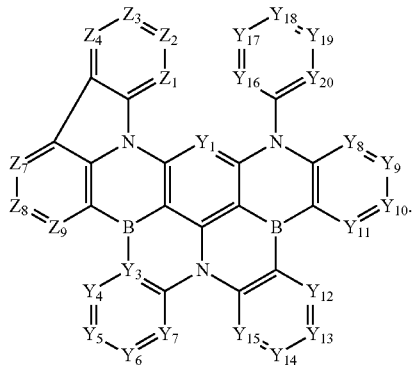

In Formula 6, $Y_1$, $Y_3$ to $Y_{20}$, $Z_1$ to $Z_4$, and $Z_7$ to $Z_9$ are the same as defined with respect to Formula 2-3.

In an embodiment, the compound represented by Formula 1 may be any one selected from compounds represented by Compound Group 1 below.

An embodiment of the present disclosure provides a polycyclic compound represented by Formula 1.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
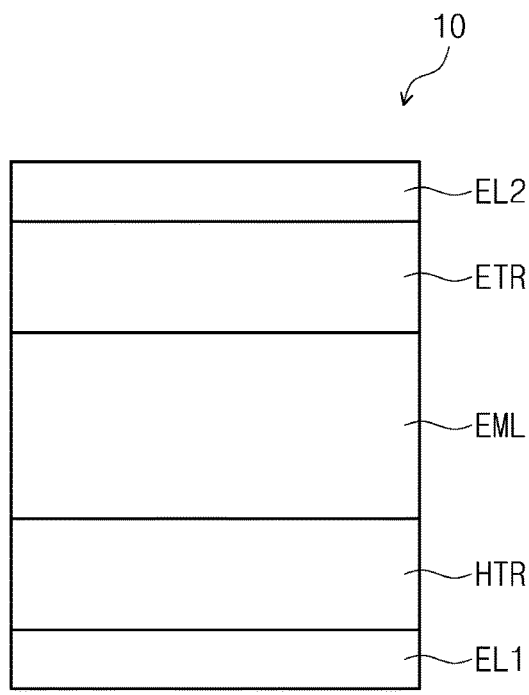
FIG. 1 is a cross-sectional view schematically illustrating an organic electroluminescence device according to an embodiment of the present disclosure.

The subject matter of the present disclosure may have various suitable modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. For example, a first element could be termed a second element without departing from the spirit and scope of the present disclosure. Similarly, a second element could be termed a first element. As used herein, the singular forms are intended to include the plural forms as well, unless the context clearly indicates otherwise.

In the description, it should be understood that the term "comprise" or "have" intends to mean that there may be specified features, numerals, steps, operations, elements, parts, or combinations thereof, not excluding the possibility of the presence or addition of the specified features, numerals, steps, operations, elements, parts, or combinations thereof. It will also be understood that when a layer, a film, a region, a plate, etc. is referred to as being "on" another part, it can be "directly on" the other part, or intervening layers may also be present.

Hereinafter, an organic electroluminescence device according to an embodiment of the present disclosure will be described with reference to FIGS. 1 to 3.

Figure 2:
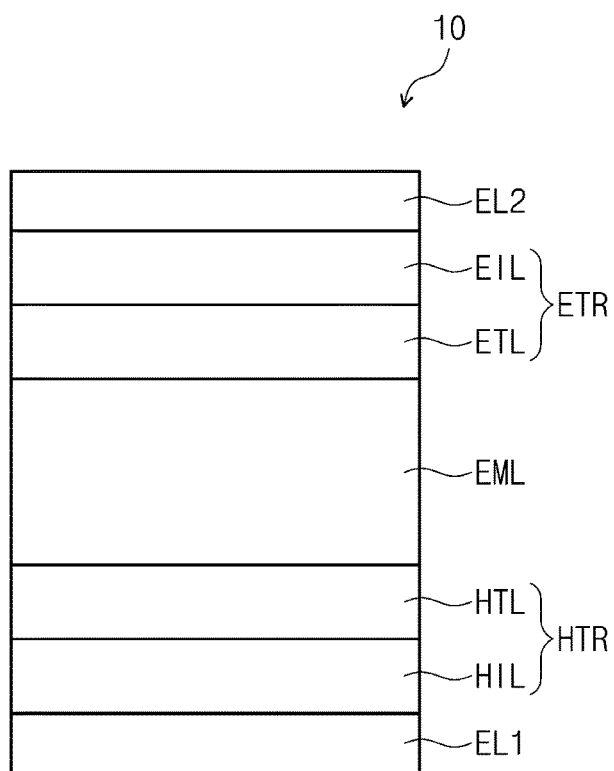
FIG. 2 is a cross-sectional view schematically illustrating an organic electroluminescence device according to an embodiment of the present disclosure.
Figure 3:
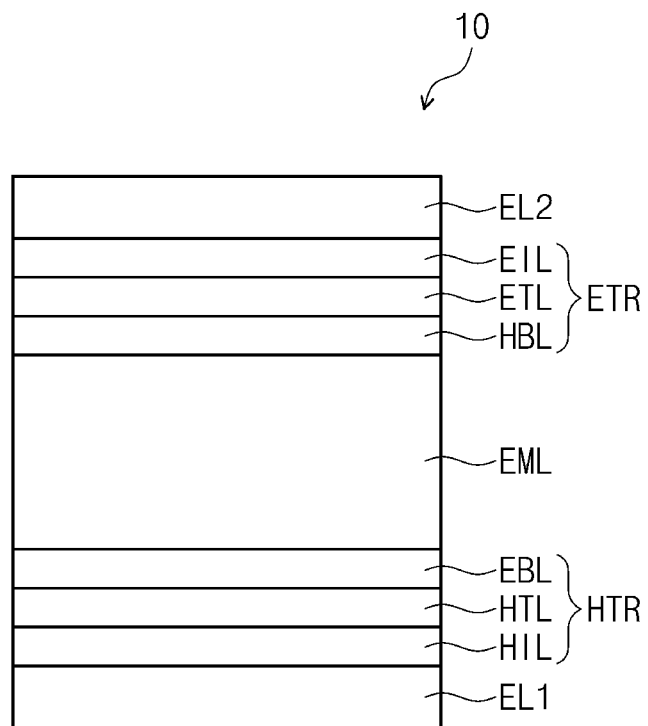
FIG. 3 is a cross-sectional view schematically illustrating an organic electroluminescence device according to an embodiment of the present disclosure.

Referring to FIGS. 1 to 3, the organic electroluminescence device 10 according to an embodiment may include a first electrode EL1, a hole transport region HTR, an emission layer EML, an electron transport region ETR, and a second electrode EL2, which are sequentially laminated.

The first electrode EL1 and the second electrode EL2 may face each other, and a plurality of organic layers may be between the first electrode EL1 and the second electrode EL2. The plurality of organic layers may include a hole transport region HTR, an emission layer EML, and an electron transport region ETR. The organic electroluminescence device 10 of an embodiment may include an embodiment of a polycyclic compound of the present disclosure in the emission layer EML.

As compared with FIG. 1, FIG. 2 illustrates a cross-sectional view of the organic electroluminescence device 10 according to an embodiment in which a hole transport region HTR includes a hole injection layer HIL and a hole transport layer HTL, and an electron transport region ETR includes an electron injection layer EIL and an electron transport layer ETL. In addition, as compared with FIG. 1, FIG. 3 illustrates a cross-sectional view of the organic electroluminescence device 10 according to an embodiment in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

In the organic electroluminescence device 10 of an embodiment, the first electrode EL1 may have conductivity (e.g., electrical conductivity). The first electrode EL1 may be formed of a metal alloy or a conductive compound (e.g., an electrically conductive compound). The first electrode EL1 may be an anode.

The first electrode EL1 may be a transmissive electrode, a transflective electrode, or a reflective electrode. When the first electrode EL1 is a transmissive electrode, the first electrode EL1 may be formed of a transparent metal oxide, for example, indium tin oxide (ITO), indium zinc oxide (IZO), zinc oxide (ZnO), indium tin zinc oxide (ITZO), and/or the like. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the first electrode EL1 may have a structure which has a plurality of layers including: a reflective layer or a transflective layer formed of any of the materials referred to herein; and a transparent conductive layer formed of ITO, IZO, ZnO, ITZO, and/or the like. For example, the first electrode EL1 may have a multi-layered structure of ITO/Ag/ITO.

The hole transport region HTR may be on the first electrode EL1. The hole transport region HTR may include at least one of a hole injection layer HIL, a hole transport layer HTL, a hole buffer layer, or an electron blocking layer EBL.

The hole transport region HTR may have a structure of: a single layer formed of a single material; a single layer formed of a plurality of different materials; or a multi-layer having a plurality of layers formed of a plurality of different materials.

For example, the hole transport region HTR may have a structure of a single layer which is a hole injection layer HIL or a hole transport layer HTL, or may have a structure of a single layer formed of a hole injection material and a hole transport material. In some embodiments, the hole transport region HTR may have a structure of a single layer formed of a plurality of different materials, or may have a structure of, sequentially laminated from the first electrode EL1, hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, but embodiments of the present disclosure are not limited thereto.

The hole transport region HTR may be formed by using various suitable methods such as, for example, a vacuum deposition method, a spin coating method, a casting method, a Langmuir-Blodgett (LB) method, an inkjet printing method, a laser printing method, or a laser induced thermal imaging (LITI) method.

The hole injection layer HIL of the organic electroluminescence device 10 according to an embodiment may include any hole injection material generally used in the art. The hole injection layer HIL may include, for example, triphenylamine-containing polyetherketone (TPAPEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4''-tris(N,N-diphenylamino)triphenylamine (TDATA), 4,4',4''-tris(N,N-2-naphthylphenylamino)triphenylamine (2-TNATA), polyaniline/dodecylbenzene sulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), dipyrazino[2,3-f:2',3'-h]quinoxaline-2,3,6,7,10,11-hexacarbonitrile (HAT-CN), and/or the like, but embodiments of the present disclosure are not limited thereto.

The hole transport layer HTL of the organic electroluminescence device 10 according to an embodiment may include any suitable material generally used in the art. The hole transport layer HTL may include, for example, 1,1-bis[(di-4-tolylamino)phenyl]cyclohexane (TAPC), a carbazole derivative such as N-phenylcarbazole or polyvinylcarbazole, N,N'-bis(3-methylphenyl)-N,N'-diphenyl-(1,1-biphenyl)-4,4'-diamine (TPD), 4,4',4''-tris(N-carbazolyl)triphenylamine (TCTA), N,N'-di(1-naphthyl)-N,N'-diphenylbenzidine (NPB), N,N'-bis(1-naphthyl)-N,N'-diphenyl-4,4'-diamine (α-NPD), and/or the like, but embodiments of the present disclosure are not limited thereto.

In some embodiments, the hole transport region HTR may further include an electron blocking layer EBL, and the electron blocking layer EBL may be between the hole transport layer HTL and the emission layer EML. The electron blocking layer EBL may serve to prevent or reduce electron injection from the electron transport region ETR to the hole transport region HTR.

The electron blocking layer EBL may include any suitable material generally used in the art. The electron blocking layer EBL may include, for example, a carbazole-based derivative such as N-phenylcarbazole or polyvinylcarbazole, a fluorine-based derivative, a triphenylamine-based derivative such as N,N'-bis(3-methylphenyl)-N,N'-diphenyl-(1,1-biphenyl)-4,4'-diamine (TPD) or 4,4',4''-tris(N-carbazolyl)triphenylamine (TCTA), N,N'-di(naphthalene-1-yl)-N,N'-diphenyl-benzidine (NPB), 4,4'-cyclohexylidene-bis [N,N-bis(4-methylphenyl)benzenamine] (TAPC), 4,4'-bis [N,N'-(3-tolyl)amino]-3,3'-dimethylbiphenyl (HMTPD), mCP, and/or the like. Furthermore, as described above, the electron blocking layer EBL may include a polycyclic compound according to an embodiment of the present disclosure.

A thickness of the hole transport region HTR may be about 100-10000 Å, for example, about 100-5000 Å. A thickness of the hole injection layer HIL may be, for example, about 30-1000 Å, and a thickness of the hole transport layer HTL may be about 30-1000 Å. A thickness of the electron blocking layer EBL may be, for example, about 10-1000 Å. When the thicknesses of the hole transport region HTR, the hole injection layer HIL, the hole transport layer HTL, and the electron blocking layer EBL satisfy the described ranges, suitable or satisfactory hole transport performance may be achieved without substantial rise of a driving voltage.

The hole transport region HTR may further include a charge-generating material in addition to the described materials to improve conductivity (e.g., electrical conductivity). The charge-generating material may be uniformly or ununiformly dispersed in the hole transport region HTR. The charge-generating material may be, for example, a p-dopant. The p-dopant may be one of a quinone derivative, a metal oxide, and/or a cyano group-containing compound, but embodiments of the present disclosure are not limited thereto. Non-limiting examples of the p-dopant may include, for example, a quinone derivative (such as tetracyanoquinodimethane (TCNQ) or 2,3,5,6-tetrafluoro-tetracyanoquinodimethane (F4-TCNQ)), a metal oxide (such as a tungsten oxide or a molybdenum oxide), and/or the like, but embodiments of the present disclosure are not limited thereto.

As described above, the hole transport region HTR may further include at least one of the hole buffer layer or the electron blocking layer EBL in addition to the hole injection layer HIL and the hole transport layer HTL. The hole buffer layer may improve luminous efficiency by compensating for a resonance distance depending on the wavelength of the light emitted from the emission layer EML. The materials included in the hole transport region HTR may also be used as materials included in the hole buffer layer.

The emission layer EML may be on the hole transport region HTR. A thickness of the emission layer EML may be, for example, about 100-600 Å. The emission layer EML may have a structure of: a single layer formed of a single material; a single layer formed of a plurality of different materials; or a multi-layer having a plurality of layers formed of a plurality of different materials.

The emission layer EML may emit one of red light, green light, blue light, white light, yellow light, or cyan light. The emission layer EML may include a fluorescence emission material or a phosphorescence emission material.

In an embodiment, the emission layer EML may be a fluorescence emission layer. For example, some of the lights emitted from the emission layer EML may be emitted by thermally activated delayed fluorescence (TADF). For example, the emission layer EML may include emission components which emit thermally activated delayed fluorescence, and in an embodiment, the emission layer EML may be a thermally activated delayed fluorescence emission layer which emits blue light.

In an embodiment, the emission layer EML may be an emission layer which emits blue light. For example, the emission layer EML may be an emission layer which emits blue light of about 400-470 nm.

In the description, the term "substituted or unsubstituted" corresponds to substituted or unsubstituted with at least one substituent selected from the group consisting of a deuterium atom, a halogen atom, a cyano group, a nitro group, an amino group, a silyl group, a boron group, a phosphine oxide group, a phosphine sulfide group, an alkyl group, an alkenyl group, an aryl group, and a heterocyclic group. In addition, each of the substituents exemplified above may be substituted or unsubstituted. For example, a biphenyl group may be interpreted as an aryl group or a phenyl group substituted with a phenyl group.

In the present description, the expression "being bonded to an adjacent group to form a ring" may mean being bonded to an adjacent group to form a substituted or unsubstituted hydrocarbon ring, or a substituted or unsubstituted heterocyclic ring. The hydrocarbon ring includes an aliphatic hydrocarbon ring and an aromatic hydrocarbon ring. The heterocyclic ring includes an aliphatic heterocyclic ring and an aromatic heterocyclic ring. The hydrocarbon ring and heterocyclic ring may be a monocyclic ring or a polycyclic ring. In addition, the ring formed by being bonded to an adjacent group may be connected to another ring to form a spiro structure.

In the present description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the present description, the halogen atom may be, for example, a fluorine atom, a chlorine atom, a bromine atom, or an iodine atom.

In the description, the alkyl group may be a linear, branched, or cyclic type (e.g., a linear, branched, or cyclic alkyl group). The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, and/or the like, but embodiments of the present disclosure are not limited thereto.

In the present description, the aryl group means an optional functional group or substituent derived from an aromatic hydrocarbon ring. The aryl group may be a monocyclic aryl group or a polycyclic aryl group. The number of ring-forming carbon in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, and/or the like, but embodiments of the present disclosure are not limited thereto.

In the description, the fluorenyl group may be substituted, and two substituents may be combined with each other to form a spiro structure. Examples of a substituted fluorenyl group are as follows, but embodiments of the present disclosure are not limited thereto.

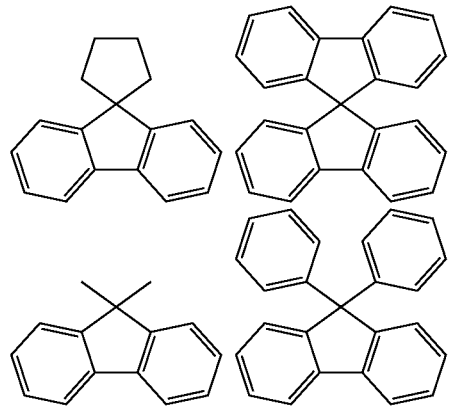

In the present description, the heteroaryl group may be a heteroaryl group including one or more of O, N, P, Si, or S as a heteroatom. The number of ring-forming carbon in the heteroaryl group may be 2 to 30 or 2 to 20. The heteroaryl group may be a monocyclic heteroaryl group or a polycyclic heteroaryl group. The polycyclic heteroaryl group may have, for example, a bicyclic structure or a tricyclic structure. Examples of the heteroaryl group may include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazolinyl group, a quinoxalinyl group, a phenoxazyl group, a phthalazinyl group, a pyrido pyrimidinyl group, a pyrido pyrazinyl group, a pyrazino pyrazinyl group, an isoquinolinyl group, indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophenyl group, a dibenzothiophenyl group, a thienothiophenyl group, a benzofuranyl group, a phenanthrolinyl group, a thiazolyl group, an isooxazolyl, an oxadiazolyl group, a thiadiazolyl group, a benzothiazolyl group, a phenothiazinyl group, a dibenzosilole group, a dibenzofuranyl group, and/or the like, but embodiments of the present disclosure are not limited thereto.

In the present description, the number of carbon atoms of the amine group is not particularly limited, but, in some embodiments, may be 1 to 30. The amine group may include an alkylamine group or an arylamine group. Examples of the amine group may include a methylamine group, a dimethylamine group, a phenylamine group, a naphthylamine group, a 9-methyl-anthracenylamine group, a triphenylamine group, and/or the like, but embodiments of the present disclosure are not limited thereto.

In an embodiment, the emission layer EML may include a polycyclic compound represented by Formula 1:

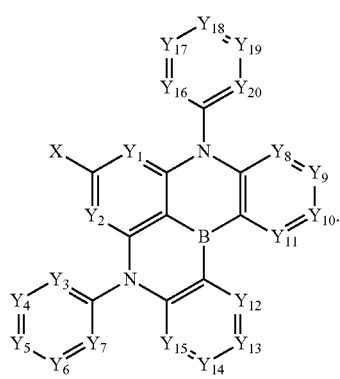

Formula 1

In Formula 1, X may be a substituted or unsubstituted amine group, a substituted or unsubstituted alkyl group having 1 to 10 carbon atoms, a substituted or unsubstituted cycloalkyl group having 5 to 30 ring-forming carbon atoms, a substituted or unsubstituted heterocycloalkyl group having 2 to 30 ring-forming carbon atoms, a substituted or unsubstituted aryl group having 6 to 30 ring-forming carbon atoms, or a substituted or unsubstituted heteroaryl group having 2 to 30 ring-forming carbon atoms.

In Formula 1, $Y_1$ to $Y_{20}$ may each independently be $CR_1$ or N, wherein at least one selected from $Y_1$ to $Y_{20}$ may be N.

In Formula 1, $R_1$ may be a hydrogen atom, a deuterium atom, a halogen atom, a boron group, a nitrile group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

The polycyclic compound according to the present disclosure may include a condensed ring including nitrogen and boron as shown in Formula 1, and at least three nitrogen (N) atoms may be included in the condensed ring.

In an embodiment, at least one selected from $Y_1$ to $Y_{15}$ in Formula 1 may be N.

In an embodiment, at least one selected from $Y_1$ to $Y_7$ in Formula 1 may be N. In this case, Formula 1 may be represented by Formula 1-1 below:

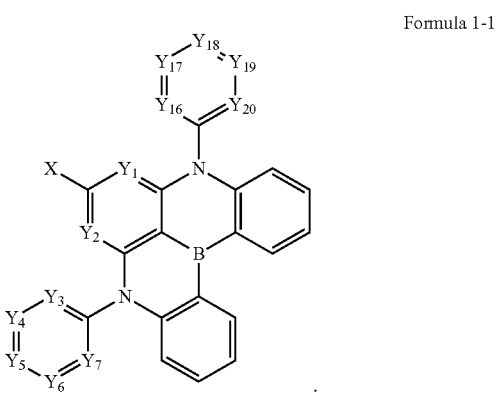

Formula 1-1

In Formula 1-1, X, $Y_1$ to $Y_7$, and $Y_{16}$ to $Y_{20}$ are the same as defined with respect to Formula 1.

In an embodiment, Formula 1 may be represented by any one selected from Formulae 2-1 to 2-3 below:

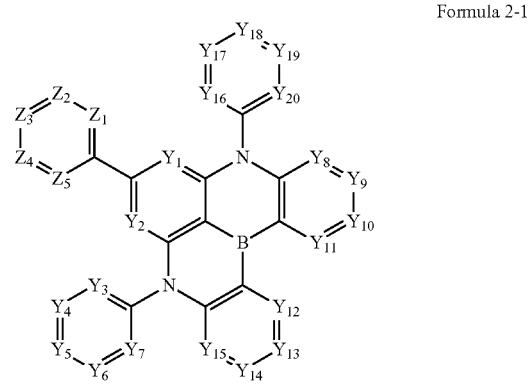

Formula 2-1

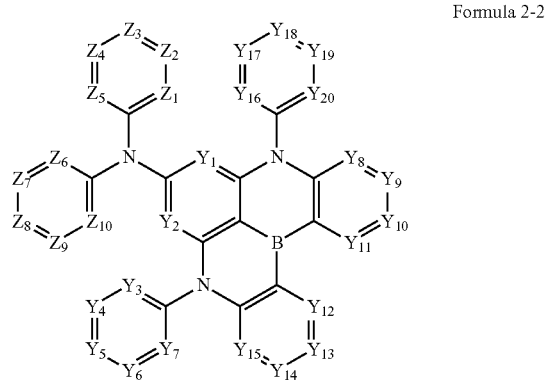

Formula 2-2

-continued

Formula 2-3

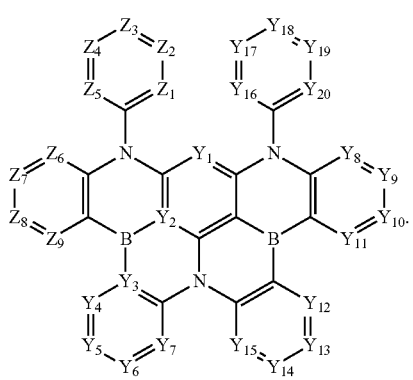

In Formulae 2-1 to 2-3, $Z_1$ to $Z_{10}$ may each independently be N or $CR_2$, wherein $R_2$ may be a hydrogen atom, a deuterium atom, a halogen atom, a boron group, a nitrile group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formulae 2-1 to 2-3, $Y_1$ to $Y_{20}$ are the same as defined with respect to Formula 1.

In an embodiment, at least one selected from $Y_1$ and $Y_2$ in Formulae 2-1 and 2-2 may be N.

In an embodiment, $Y_1$ in Formula 2-3 may be N.

In an embodiment, Formula 2-1 may be represented by Formula 3-1 or 3-2 below:

Formula 3-1

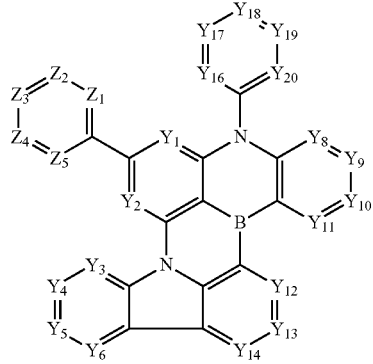

Formula 3-2

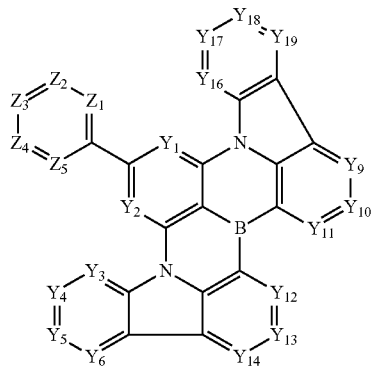

In Formulae 3-1 and 3-2, $Y_1$ to $Y_6$, $Y_8$ to $Y_{14}$, $Y_{16}$ to $Y_{20}$, and $Z_1$ to $Z_5$ are the same as defined with respect to Formula 2-1. For example, in Formula 3-1, $Y_1$ to $Y_6$, $Y_8$ to $Y_{14}$, $Y_{16}$ to $Y_{20}$, and $Z_1$ to $Z_5$ are the same as defined with respect to Formula 2-1. And, in Formula 3-2, $Y_1$ to $Y_6$, $Y_9$ to $Y_{14}$, $Y_{16}$ to $Y_{19}$, and $Z_1$ to $Z_5$ are the same as defined with respect to Formula 2-1.

In an embodiment, Formula 2-1 may be represented by Formula 4 below:

Formula 4

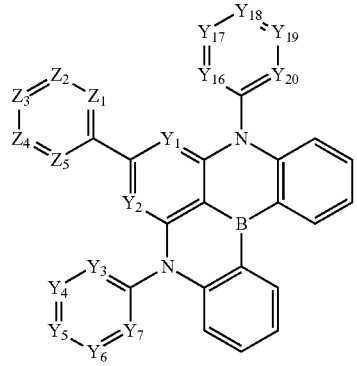

In Formula 4, $Y_1$ to $Y_7$, $Y_{16}$ to $Y_{20}$, and $Z_1$ to $Z_5$ are the same as defined with respect to Formula 2-1.

In an embodiment, Formula 2-2 may be represented by Formula 5 below:

Formula 5

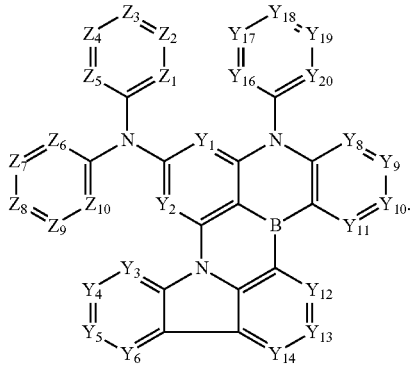

In Formula 5, $Y_1$ to $Y_6$, $Y_8$ to $Y_{14}$, $Y_{16}$ to $Y_{20}$, and $Z_1$ to $Z_{10}$ are the same as defined with respect to Formula 2-2.

In an embodiment, Formula 2-3 may be represented by Formula 6 below:

Formula 6

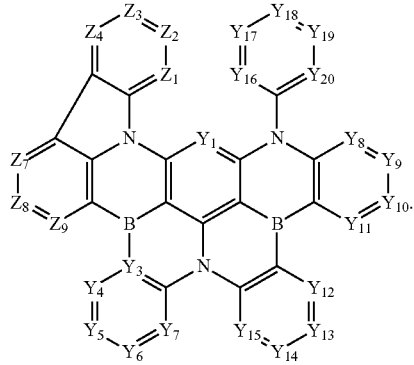

In Formula 6, $Y_1$, $Y_3$ to $Y_{20}$, $Z_1$ to $Z_4$, and $Z_7$ to $Z_9$ are the same as defined with respect to Formula 2-3.

The polycyclic compound of an embodiment represented by Formula 1 may be a delayed fluorescence emission material. The polycyclic compound of an embodiment may be a thermally activated delayed fluorescence material.

For example, the polycyclic compound represented by Formula 1 has a small difference between a singlet energy level (S1) and a triplet energy level (T1), and accordingly may be used as a thermally activated delayed fluorescence material. In some embodiments, the polycyclic compound represented by Formula 1 may be used as a blue light-emission material which emits thermally activated delayed fluorescence. However, embodiments of the present disclosure are not limited thereto, and the polycyclic compound of an embodiment may be a thermally activated delayed fluorescence material which emits green light or red light.

The polycyclic compound of an embodiment represented by Formula 1 may be represented by any one selected from compounds represented by Compound Group 1 below:

Compound Group 1

1

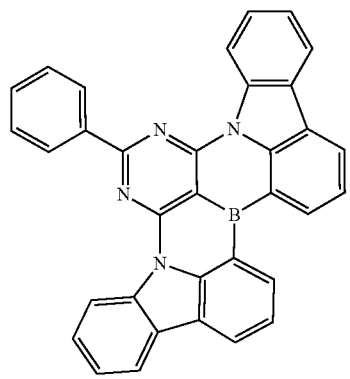

2

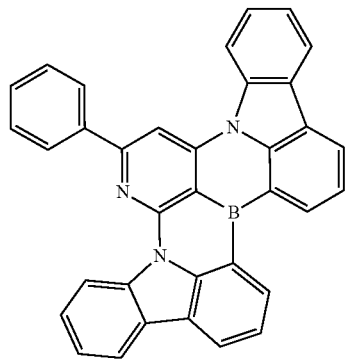

3

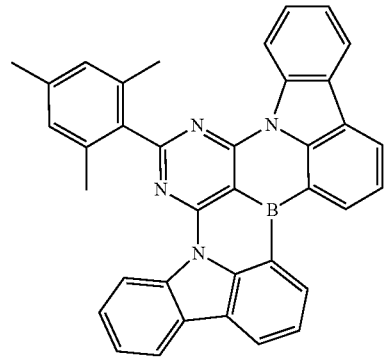

4

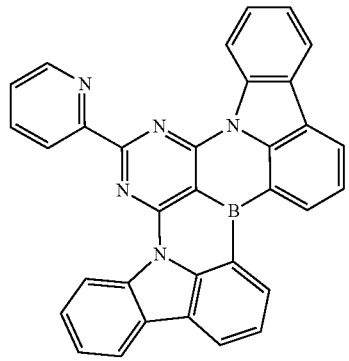

5

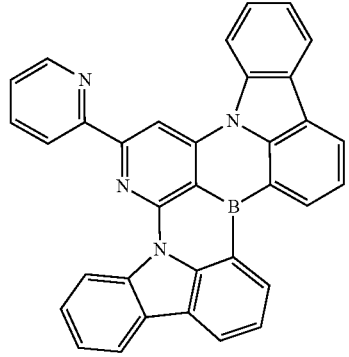

6
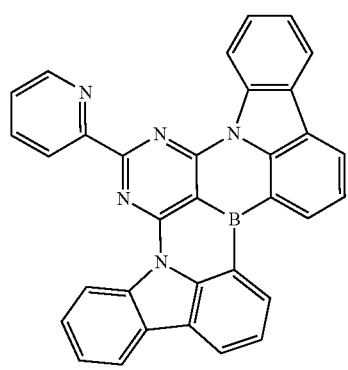
7
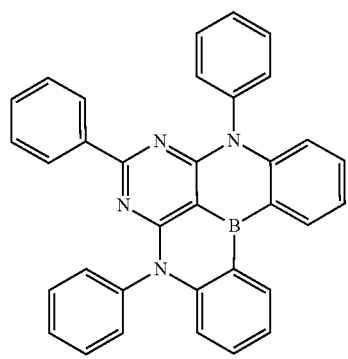
8
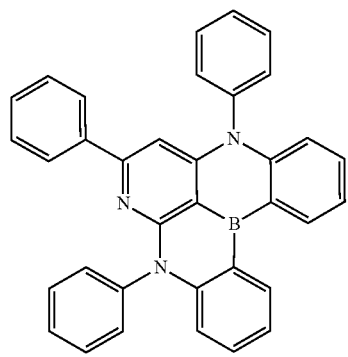
9
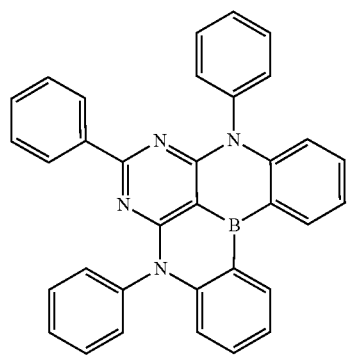
10
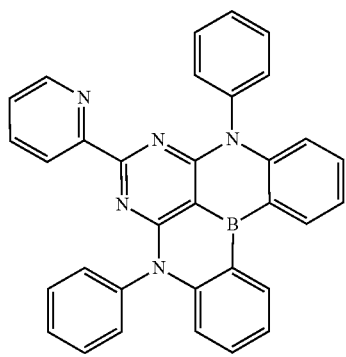
11
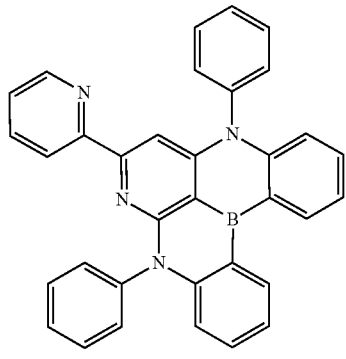
12
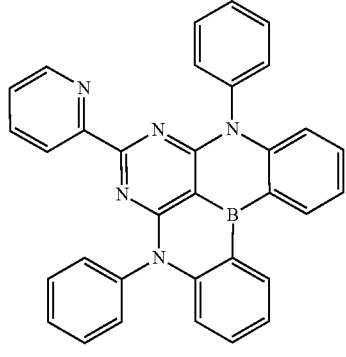
13
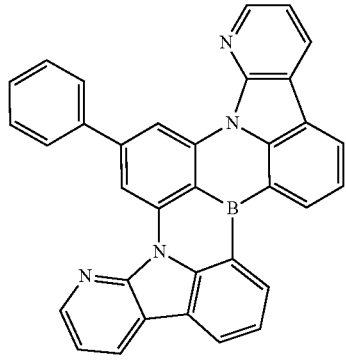

14
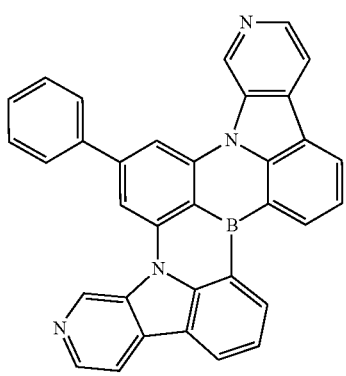
15
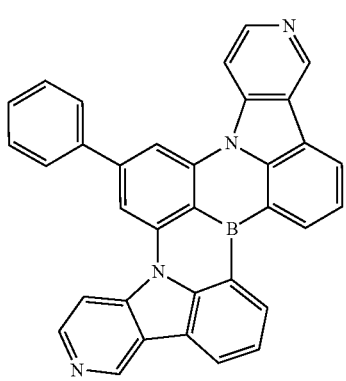
16
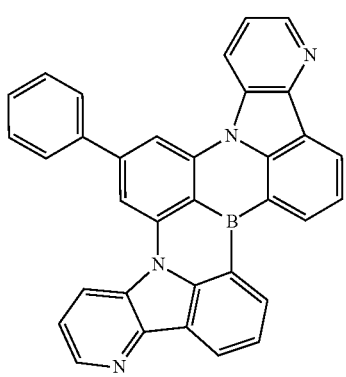
17
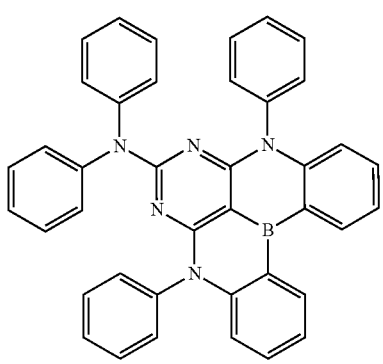
18
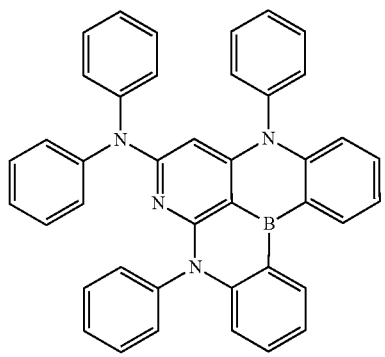
19
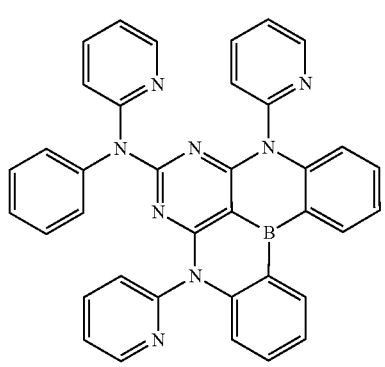
20
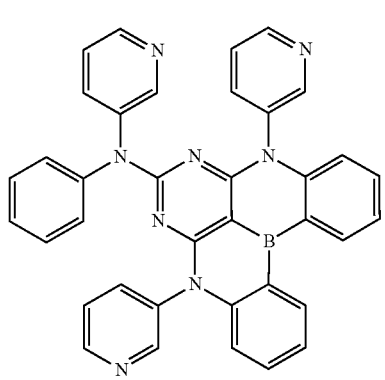
21
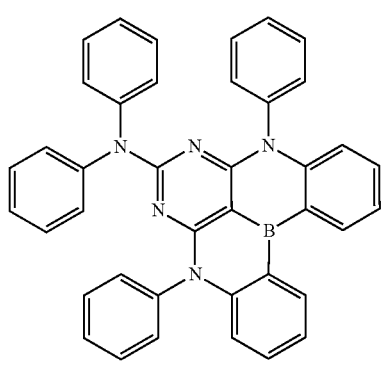

22
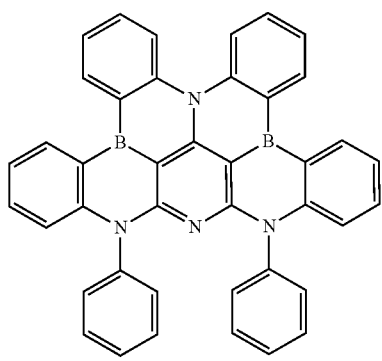
23
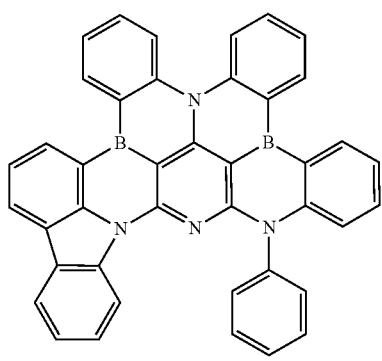
24
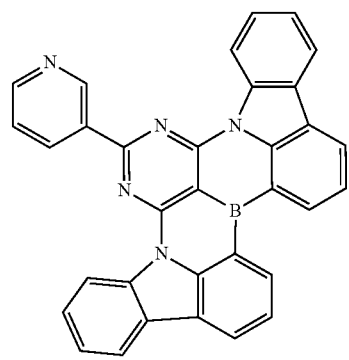
25
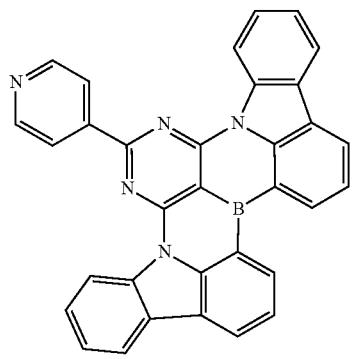
26
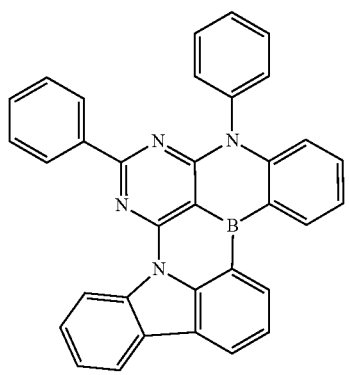
27
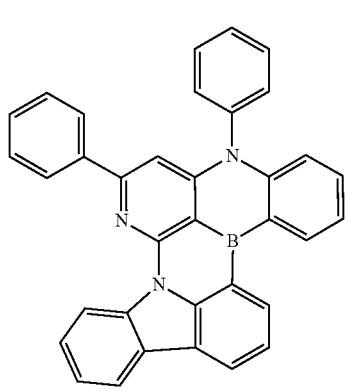
28
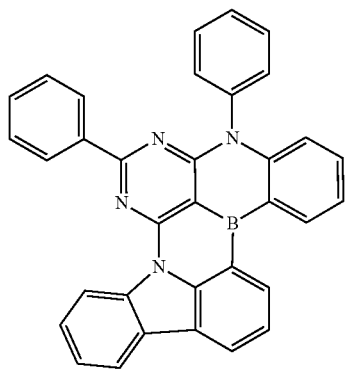
29
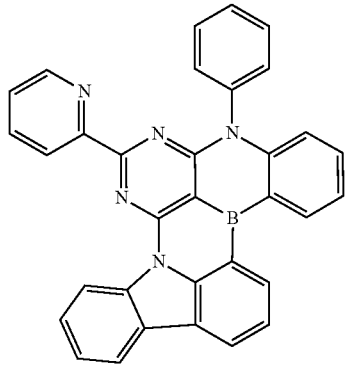

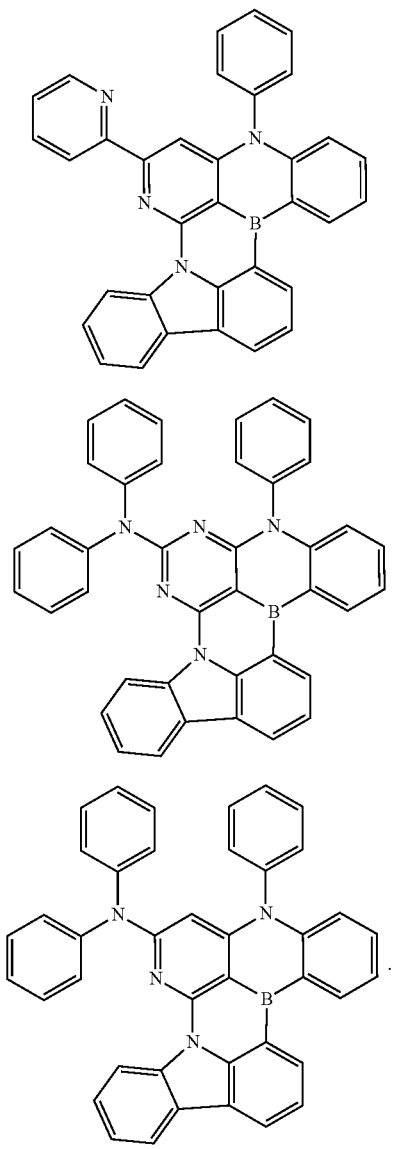

The described polycyclic compound represented by Formula 1 may be used in the organic electroluminescence device 10 of an embodiment to improve the efficiency and life-time of the organic electroluminescence device. For example, the described polycyclic compound represented by Formula 1 may be used in the emission layer EML of the organic electroluminescence device 10 of an embodiment to improve the luminous efficiency and life-time of the organic electroluminescence device.

In an embodiment, the emission layer EML may include a host and a dopant, and the host may be a host for delayed fluorescence emission and the dopant may be a dopant for delayed fluorescence emission.

In an embodiment, the polycyclic compound of an embodiment represented by Formula 1 may be included as a dopant material in the emission layer EML. For example, the polycyclic compound of an embodiment represented by Formula 1 may be used as a TADF dopant.

In some embodiments, the emission layer EML in the organic electroluminescence device 10 of an embodiment may further include any suitable dopant material generally used in the art. The emission layer EML of an embodiment may include, as a dopant, a styryl derivative (e.g., 1,4-bis [2-(3-N-ethylcarbazoryl)vinyl]benzene (BCzVB), 4-(di-p-tolylamino)-4'-[(di-p-tolylamino)styryl]stilbene (DPAVB), or N-(4-((E)-2-(6-((E)-4-(diphenylamino)styryl)naphthalen-2-yl)vinyl)phenyl)-N-phenylbenzenamine (N-BDAVBi)), perylene and a derivative thereof (e.g., 2,5,8,11-tetra-t-butylperylene (TBP)), pyrene and a derivative thereof (such as 1,1-dipyrene, 1,4-dipyrenylbenzene, or 1,4-bis(N,N-diphenylamino)pyrene), 1,3,5-tris(N-phenylbenzimidazole-2-yl)benzene (TPBi), and/or the like.

In an embodiment, the polycyclic compound of an embodiment represented by Formula 1 may be included as a host material in the emission layer EML. For example, the polycyclic compound of an embodiment represented by Formula 1 may be used as a TADF host.

In some embodiments, the emission layer EML may further include any suitable host material generally used in the art. The emission layer EML may include, as a host material, for example, tris(8-hydroxyquinolino)aluminum (Alq₃), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino) phenyl] ether oxide (DPEPO), hexaphenylcyclotriphosphazene (CP1), 1,4-bis(triphenylsilyl)benzene (UGH2), hexaphenylcyclotrisiloxane (DPSiO₃), octaphenylcyclotetrasiloxane (DPSiO₄), 2,8-bis(diphenylphosphoryl)dibenzofuran (PPF), and/or the like. However, embodiments of the present disclosure are not limited thereto, and in addition to the described host materials, any suitable delayed fluorescence emission host material generally used in the art may be included.

Referring to FIGS. 1 to 3 again, in the organic electroluminescence device 10 of an embodiment, the electron transport region ETR may be on the emission layer EML. The electron transport region ETR may include at least one of a hole blocking layer, an electron transport layer ETL, or an electron injection layer EIL, but embodiments of the present disclosure are not limited thereto.

The electron transport region ETR may have a structure of: a single layer formed of a single material; a single layer formed of a plurality of different materials; or a multi-layer having a plurality of layers formed of a plurality of different materials.

For example, the electron transport region ETR may have a structure of a single layer which is an electron injection layer EIL or an electron transport layer ETL, or may have a structure of a single layer formed of an electron injection material and an electron transport material. In some embodiments, the electron transport region ETR may have a structure of a single layer formed of a plurality of different materials, or may have a structure of, sequentially laminated from the first electrode EL1, electron transport layer ETL/ electron injection layer EIL or hole blocking layer/electron transport layer ETL/electron injection layer EIL, but embodiments of the present disclosure are limited thereto. A thickness of the electron transport region ETR may be, for example, about 100-1500 Å.

The electron transport region ETR may be formed using various suitable methods such as, for example, a vacuum deposition method, a spin coating method, a casting method, a Langmuir-Blodgett (LB) method, an inkjet printing method, a laser printing method, or a laser induced thermal imaging (LITI) method.

When the electron transport region ETR includes the electron transport layer ETL, the electron transport region ETR may include, for example, tris(8-hydroxyquinolinato) aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) ($Bebq_2$), 9,10-di(naphthalene-2-yl)anthracene (ADN), or a mixture thereof, but embodiments of the present disclosure are not limited thereto.

When the electron transport region ETR includes the electron transport layer ETL, thicknesses of the electron transport layers ETL may be about 100-1000 Å, for example, about 150-500 Å. When the thicknesses of the electron transport layers ETL satisfy the described range, suitable or satisfactory electron transport performance may be achieved without substantial rise of a driving voltage.

When the electron transport region ETR includes the electron injection layer EIL, the electron transport region ETR may use, for example, a lanthanide metal (e.g., LiF, lithium quinolate (LiQ), $Li_2O$, BaO, NaCl, CsF, or Yb), a halogenated metal (e.g., RbCl, RbI, or KI), and/or the like, but embodiments of the present disclosure are not limited thereto. In addition, the electron injection layer EIL may be formed of a mixture of an electron transport material and an insulative organo-metal salt. The organo-metal salt may be a material having an energy band gap of about 4 eV or more. For example, the organo-metal salt may include, for example, metal acetate, metal benzoate, metal acetoacetate, metal acetylacetonate, or metal stearate.

When the electron transport region ETR includes the electron injection layer EIL, thicknesses of the electron injection layers EIL may be about 1-100 Å or about 3-90 Å. When the thicknesses of the electron injection layers EIL satisfy the described range, suitable or satisfactory electron injection performance may be achieved without substantial rise of a driving voltage.

The electron transport region ETR may include the hole blocking layer as described above. The hole blocking layer may include, for example, at least one of 2,9-dimethyl-4,7-diphenyl-1,10-phenanthroline (BCP) or 4,7-diphenyl-1,10-phenanthroline (Bphen), but embodiments of the present disclosure are not limited thereto.

The second electrode EL2 may be on the electron transport region ETR. The second electrode EL2 may have conductivity (e.g., electrical conductivity). The second electrode EL2 may be formed of a metal alloy or a conductive compound (e.g., an electrically conductive compound). The second electrode EL2 may be a cathode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), and/or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture thereof (e.g., a mixture of Ag and Mg). In some embodiments, the second electrode EL2 may be a structure which has a plurality of layers including: a reflective layer or a transflective layer formed of the described materials; and a transparent conductive layer formed of ITO, IZO, ZnO, ITZO, and/or the like.

In some embodiments, the second electrode EL2 may be coupled to an auxiliary electrode. When the second electrode EL2 is coupled to the auxiliary electrode, resistance of the second electrode EL2 may be reduced.

In the organic electroluminescence device 10, as a voltage is applied to the first electrode EL1 and the second electrode EL2, respectively, the holes injected from the first electrode EL1 may move through the hole transport region HTR to the emission layer EML and the electrons injected from the second electrode EL2 may move through the electron transport region ETR to the emission layer EML. The electrons and the holes may be recombined in the emission layer EML to generate excitons, and the excitons may emit light when the excitons fall back (e.g., transition or relax) from an excited state to a ground state.

When the organic electroluminescence device 10 is a top emission type (e.g., a top emission device), the first electrode EL1 may be a reflective electrode and the second electrode EL2 may be a transmissive electrode or a transflective electrode. When the organic electroluminescence device 10 is a bottom emission type (e.g., a bottom emission device), the first electrode EL1 may be a transmissive electrode or a transflective electrode and the second electrode EL2 may be a reflective electrode.

The organic electroluminescence device 10 according to an embodiment of the present disclosure may exhibit the improved luminous efficiency and life-time characteristics using the described polycyclic compound as an emission layer material.

An embodiment of the present disclosure provides a polycyclic compound represented by Formula 1 below:

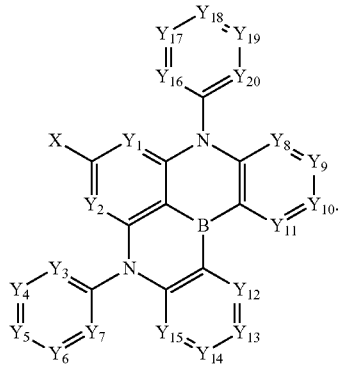

Formula 1

In Formula 1, X may be a substituted or unsubstituted amine group, a substituted or unsubstituted alkyl group having 1 to 10 carbon atoms, a substituted or unsubstituted cycloalkyl group having 5 to 30 ring-forming carbon atoms, a substituted or unsubstituted heterocycloalkyl group having 2 to 30 ring-forming carbon atoms, a substituted or unsubstituted aryl group having 6 to 30 ring-forming carbon atoms, or a substituted or unsubstituted heteroaryl group having 2 to 30 ring-forming carbon atoms.

In Formula 1, $Y_1$ to $Y_{20}$ may each independently be $CR_1$ or N, wherein at least one selected from $Y_1$ to $Y_{20}$ may be N.

In Formula 1, $R_1$ may be a hydrogen atom, a deuterium atom, a halogen atom, a boron group, a nitrile group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

The description for the polycyclic compound described in the organic electroluminescence device of an embodiment may be equally applied to the polycyclic compound of an embodiment represented by Formula 1.

The polycyclic compound according to an embodiment may be any one selected from the compounds represented by described Compound Group 1.

Hereinafter, the present disclosure will be explained in more detail with reference to Examples and Comparative Examples. In addition, the following embodiments are only examples to assist understanding of the present disclosure, and the scope of the present disclosure is not limited thereto.

EXAMPLE

1. Synthesis of Polycyclic Compound

The polycyclic compound according to an embodiment of the present disclosure may be synthesized, for example, as follows. However, the synthesis method for the polycyclic compound according to an embodiment of the present disclosure is not limited thereto.

1-1. Synthesis of Compound 1

Reaction Equation

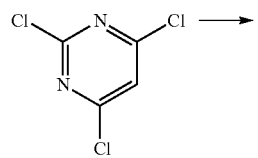

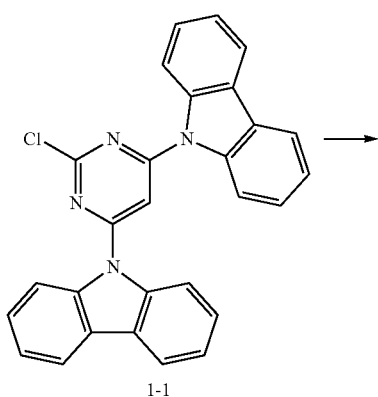

1-1

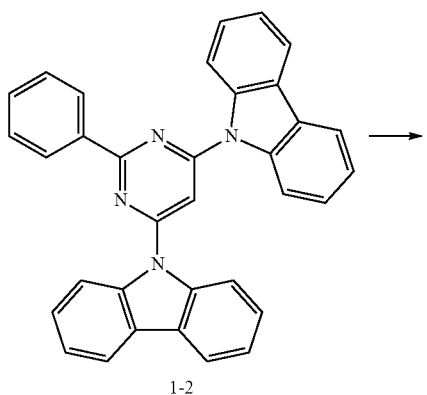

1-2

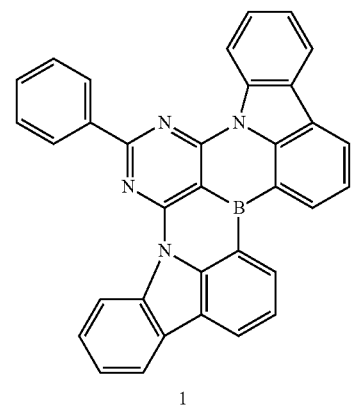

1

Synthesis of Intermediate 1-1

Carbazole and nBuLi were reacted, and then 2,4,6-trichloropyrimidine was added dropwise to obtain Compound 1-1. The molecular weight of the intermediate 1-1 measured by liquid chromatography mass spectrometry (hereinafter, referred to as LC/MS) was 445.22.

Synthesis of Intermediate 1-2

The intermediate 1-1 and phenylboronic acid were reacted under a Suzuki coupling condition to obtain Compound 1-2. The molecular weight of the intermediate 1-2 measured by LC/MS was 487.21.

Synthesis of Compound 1

2.1 g of the intermediate 1-2 was added into a reaction vessel, and 20 mL of o-dichlorobenzene was added dropwise thereto in a nitrogen atmosphere. Thereafter, 1.6 g of tribromoborane was slowly added dropwise at 0° C. The reaction temperature was raised to 180° C., and then the mixture was refluxed for 12 hours. After completion of the reaction, the reaction solution was extracted with ethyl acetate, and the collected organic layer was dried over magnesium sulfate, and the solvent was evaporated, and then the obtained residue was separated and purified by silica gel column chromatography to obtain 0.94 g (yield: 44%) of Compound 1.

1-2. Synthesis of Compound 3
Reaction Equation

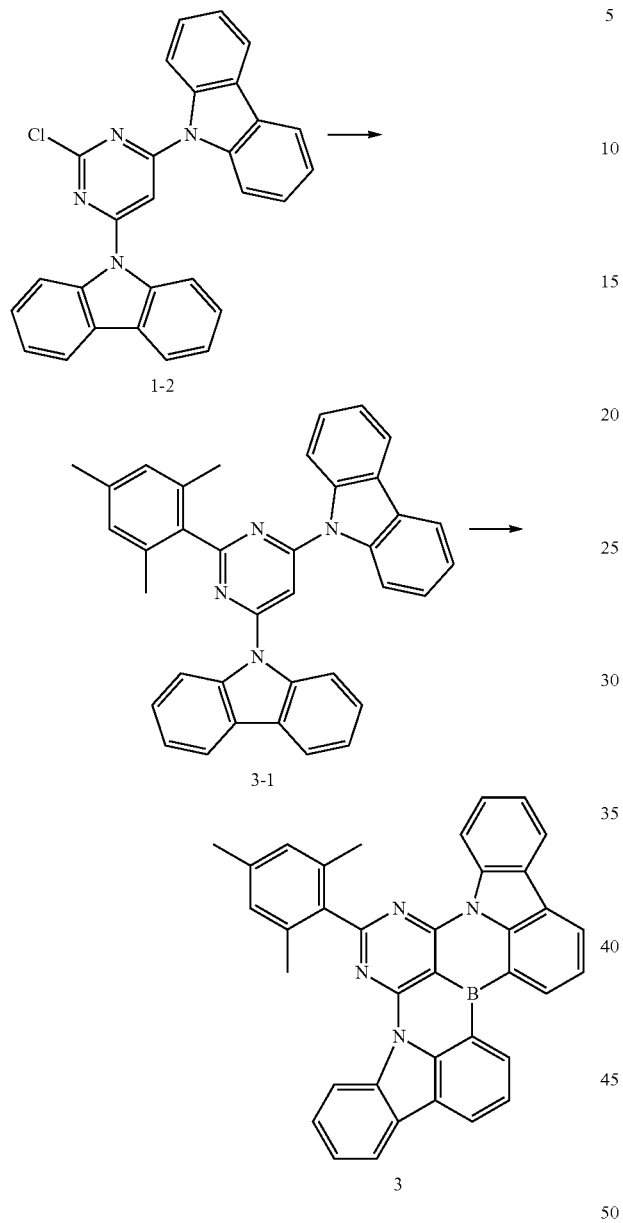

1-3. Synthesis of Compound 13
Reaction Equation

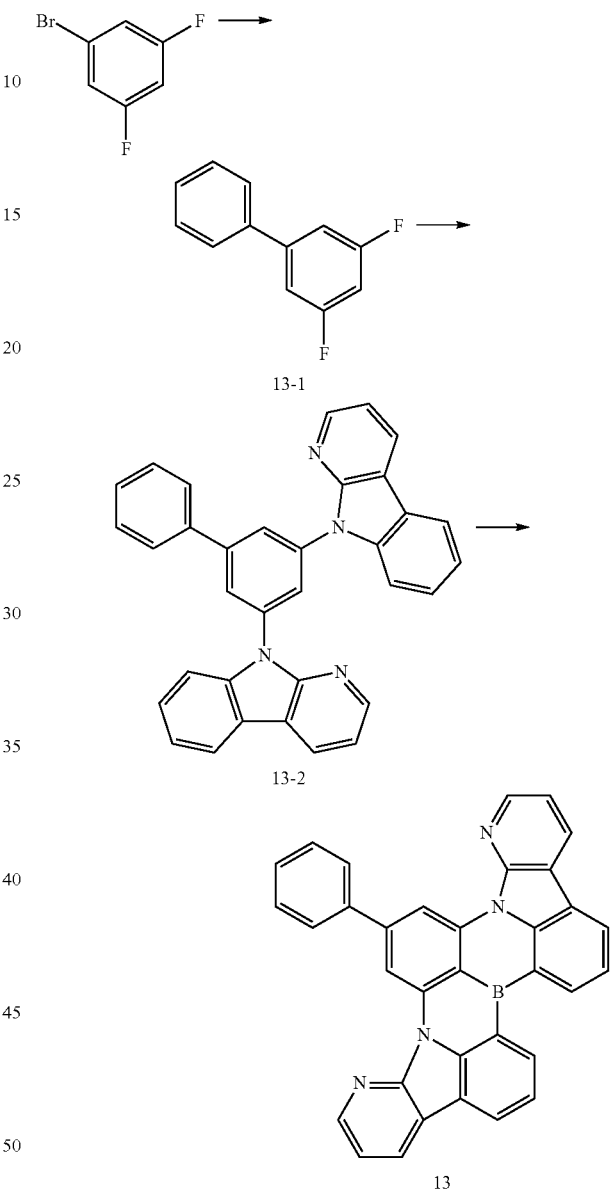

Synthesis of Intermediate 3-1

The intermediate 1-2 and 2,4,6-trimethylbenzene-1-boronic acid were reacted under a Suzuki coupling condition to obtain Compound 3-1. The molecular weight of the intermediate 3-1 measured by LC/MS was 529.31.

Synthesis of Compound 3

1.8 g of the intermediate 3-1 was added into a reaction vessel, and 20 mL of o-dichlorobenzene was added dropwise thereto in a nitrogen atmosphere. Thereafter, 1.3 g of tribromoborane was slowly added dropwise at 0° C. The reaction temperature was raised to 180° C., and then the mixture was refluxed for 12 hours. After completion of the reaction, the reaction solution was extracted with ethyl acetate, and the collected organic layer was dried over magnesium sulfate, and the solvent was evaporated, and then the obtained residue was separated and purified by silica gel column chromatography to obtain 0.6 g (yield: 35%) of Compound 3.

Synthesis of Intermediate 13-1

2-bromo-4,6-difluorobenzene and phenylboronic acid were reacted under a Suzuki coupling condition to obtain Compound 13-1. The molecular weight of the intermediate 13-1 measured by LC/MS was 191.07.

Synthesis of Intermediate 13-2

The intermediate 13-1 and 9H-pyrido[2,3-b]indole were reacted under a basic condition to obtain Compound 13-2. The intermediate 13-2 was identified by LC/MS.

Synthesis of Compound 13

3.1 g of the intermediate 13-2 was added into a reaction vessel, and 30 mL of o-dichlorobenzene was added dropwise thereto in a nitrogen atmosphere. Thereafter, 2.4 g of tribromoborane was slowly added dropwise at 0° C. The reaction temperature was raised to 180° C., and then the mixture was refluxed for 12 hours. After completion of the reaction, the reaction solution was extracted with ethyl acetate, and the collected organic layer was dried over magnesium sulfate, and the solvent was evaporated, and then the obtained residue was separated and purified by silica gel column chromatography to obtain 1.6 g (yield: 51%) of Compound 13.

1-4. Synthesis of Compound 18
Reaction Equation

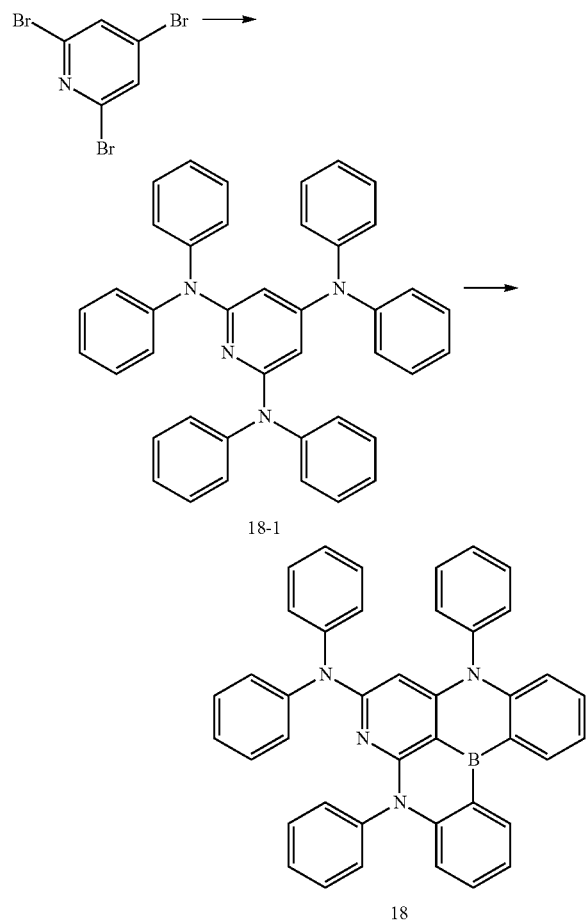

Synthesis of Intermediate 18-1

2,4,6-tribromopyridine and diphenylamine were reacted with a Pd catalyst to obtain intermediate 18-1. The molecular weight of the intermediate 18-1 measured by LC/MS was 581.22.

Synthesis of Compound 18

1.5 g of the intermediate 18-1 was added into a reaction vessel, and 15 mL of o-dichlorobenzene was added dropwise thereto in a nitrogen atmosphere. Thereafter, 0.96 g of tribromoborane was slowly added dropwise at 0° C. The reaction temperature was raised to 180° C., and then the mixture was refluxed for 12 hours. After completion of the reaction, the reaction solution was extracted with ethyl acetate, and the collected organic layer was dried over magnesium sulfate, and the solvent was evaporated, and then the obtained residue was separated and purified by silica gel column chromatography to obtain 0.93 g (yield: 61%) of Compound 18.

1-5. Synthesis of Compound 22
Reaction Equation

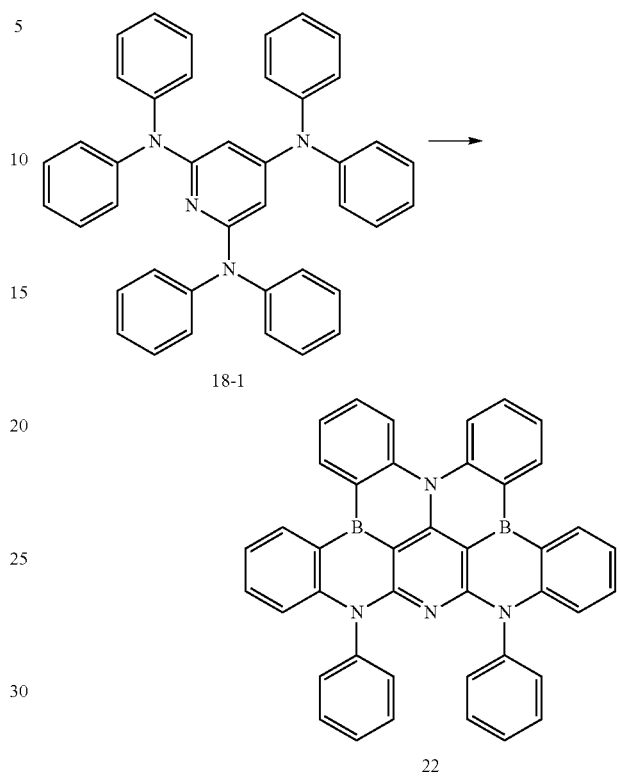

Synthesis of Compound 22

2.7 g of the intermediate 18-1 was added into a reaction vessel, and 30 mL of o-dichlorobenzene was added dropwise thereto in a nitrogen atmosphere. Thereafter, 3.5 g of tribromoborane was slowly added dropwise at 0° C. The reaction temperature was raised to 180° C., and then the mixture was refluxed for 12 hours. After completion of the reaction, the reaction solution was extracted with ethyl acetate, and the collected organic layer was dried over magnesium sulfate, and the solvent was evaporated, and then the obtained residue was separated and purified by silica gel column chromatography to obtain 1.2 g (yield: 44%) of Compound 22.

1-6. Synthesis of Compound 23
Reaction Equation

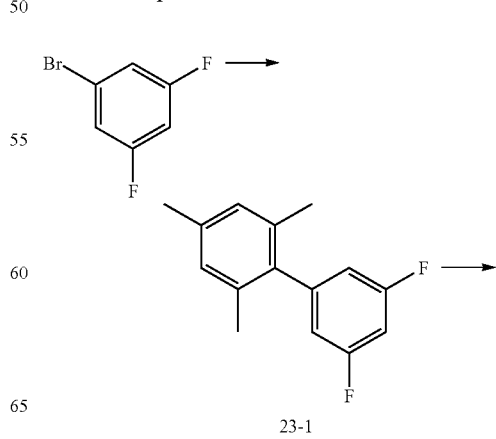

1-7. Synthesis of Compound 25
Reaction Equation

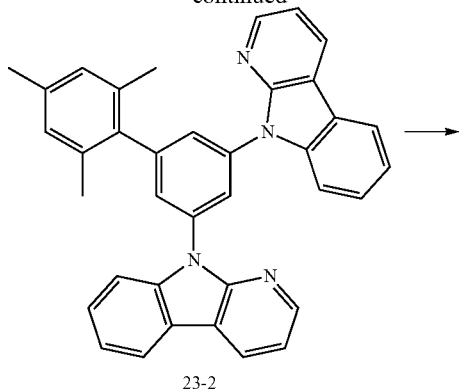

23-2

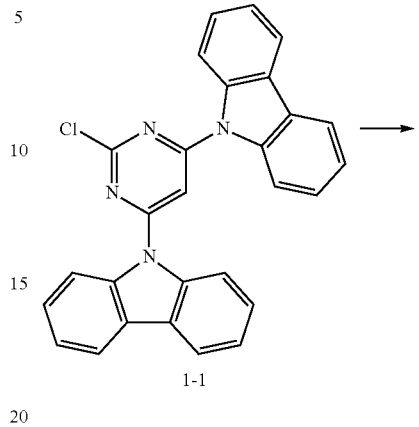

1-1

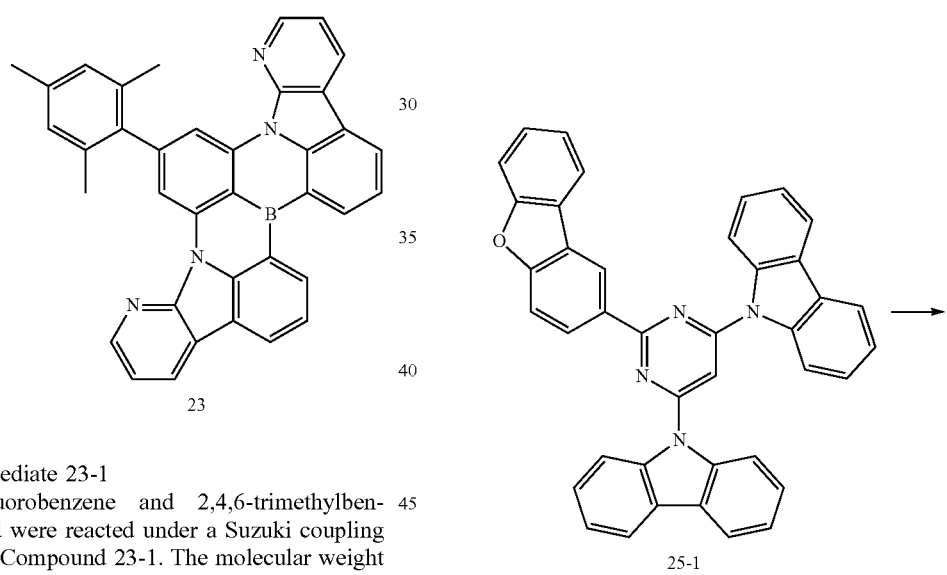

23

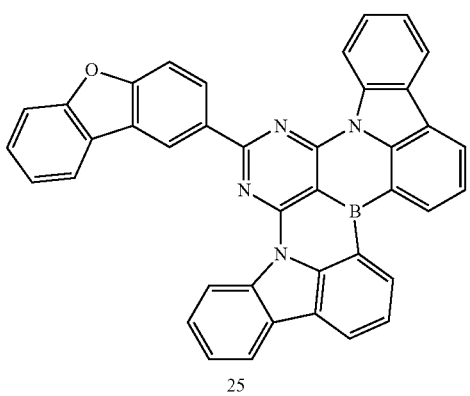

25-1

25

Synthesis of Intermediate 23-1

2-bromo-4,6-difluorobenzene and 2,4,6-trimethylbenzene-1-boronic acid were reacted under a Suzuki coupling condition to obtain Compound 23-1. The molecular weight of the intermediate 23-1 measured by LC/MS was 233.12.

Synthesis of Intermediate 23-2

The intermediate 23-1 and 9H-pyrido[2,3-b]indole were reacted under a basic condition to obtain Compound 23-2. The molecular weight of the intermediate 23-2 measured by LC/MS was 529.31.

Synthesis of Compound 23

1.9 g of the intermediate 23-2 was added into a reaction vessel, and 20 mL of o-dichlorobenzene was added dropwise thereto in a nitrogen atmosphere. Thereafter, 1.3 g of tribromoborane was slowly added dropwise at 0° C. The reaction temperature was raised to 180° C., and then the mixture was refluxed for 12 hours. After completion of the reaction, the reaction solution was extracted with ethyl acetate, and the collected organic layer was dried over magnesium sulfate, and the solvent was evaporated, and then the obtained residue was separated and purified by silica gel column chromatography to obtain 0.75 g (yield: 39%) of Compound 23.

Synthesis of Intermediate 25-1

The intermediate 1-1 and 2-dibenzofuran-boronic acid were reacted under a Suzuki coupling condition to obtain Compound 25-1. The molecular weight of the intermediate 25-1 measured by LC/MS was 577.22.

Synthesis of Compound 25

1.5 g of the intermediate 25-1 was added into a reaction vessel, and 15 mL of o-dichlorobenzene was added dropwise thereto in a nitrogen atmosphere. Thereafter, 0.97 g of tribromoborane was slowly added dropwise at 0° C. The reaction temperature was raised to 180° C., and then the mixture was refluxed for 12 hours. After completion of the reaction, the reaction solution was extracted with ethyl acetate, and the collected organic layer was dried over magnesium sulfate, and the solvent was evaporated, and then the obtained residue was separated and purified by silica gel column chromatography to obtain 0.97 g (yield: 64%) of Compound 25.

$^1$H NMR and MS/FAB measurement values of the compounds synthesized according to Synthesis Examples 1-1 to 1-7 are shown in Table 1 below. In the MS/FAB data of Table 1 below, "Found" is a measurement value of the actually measured molecular ion (M$^+$), and "calc." means a theoretical molecular weight.

TABLE 1

| Compound | $^1$H NMR (CDCl$_3$, 400 MHz) | MS/FAB Found | calc. |
|---|---|---|---|
| Compound 1 | 8.54 (d, 2H), 8.36 (d, 1H), 8.19 (d, 2H), 7.93 (d, 2H), 7.51-7.42 (m, 5H), 7.34 (t, 2H), 7.21 (t, 2H), 7.16 (t, 2H) | 494.17 | 495.22 |
| Compound 3 | 8.54 (d, 2H), 8.20 (d, 2H), 7.93 (d, 2H), 7.51 (d, 2H), 7.34 (t, 2H), 7.28 (t, 2H), 7.15 (t, 2H), 7.02 (s, 2H), 2.57 (s, 6H), 2.48 (s, 3H) | 536.22 | 537.21 |
| Compound 13 | 8.54 (d, 1H), 8.51 (d, 2H), 8.39 (d, 2H), 8.17 (s, 2H), 7.75 (d, 2H), 7.48-7.45 (m, 4H), 7.41 (d, 1H), 7.25 (t, 2H), 7.17 (t, 2H) | 494.17 | 495.24 |
| Compound 18 | 7.71 (d, 2H), 7.29 (t, 2H), 7.21-7.15 (m, 10H), 7.08-7.00 (m, 10H), 7.01-6.98 (m, 4H) | 588.25 | 589.27 |
| Compound 22 | 7.71(d, 4H), 7.29 (t, 4H), 7.24 (t, 4H), 7.18 (d, 4H), 7.08 (d, 4H), 7.01 (t, 4H), 7.00 (t, 2H) | 596.23 | 597.31 |
| Compound 23 | 8.54 (d, 21H), 8.51 (t, 2H), 8.38 (d, 2H), 8.16 (s, 2H), 7.46 (d, 2H), 7.25 (t, 2H), 7.16 (d, 24H), 7.02 (s, 2H), 2.91 (s, 6H), 2.48 (s, 3H) | 536.22 | 537.23 |
| Compound 25 | 8.54 (d, 2H), 8.198 (d, 2H), 7.99-7.90 (m, 3H), 7.88 (d, 1H), 7.83 (s, 1H), 7.78 (d, 1H), 7.54 (d, 1H), 7.50 (d, 2H), 7.39-7.34 (m, 3H), 7.31-7.28 (t, 3H), 7.15 (t, 1H) | 584.18 | 585.21 |

2. Production and Evaluation of Organic Electroluminescence Device Including Polycyclic Compound Production of Organic Electroluminescence Device The organic electroluminescence device of an embodiment in which the emission layer includes the polycyclic compound of an embodiment was produced through a method below.

Example Compound

1
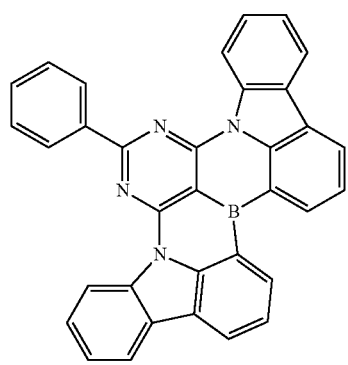

3
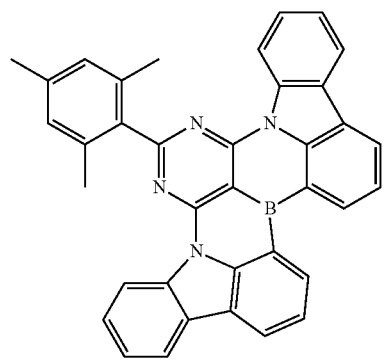

18
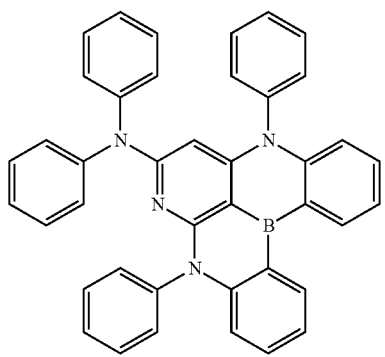

22
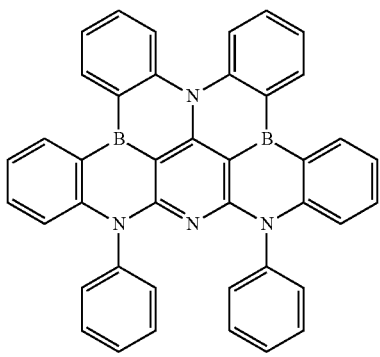

23
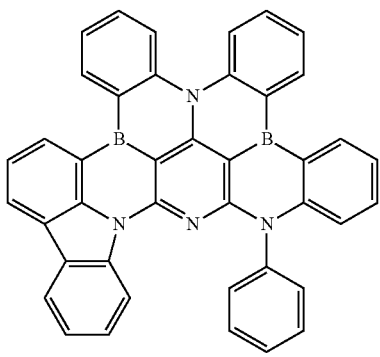

25
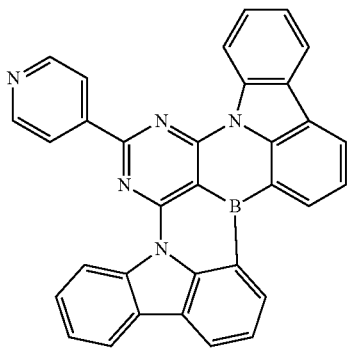

Comparative Example Compound

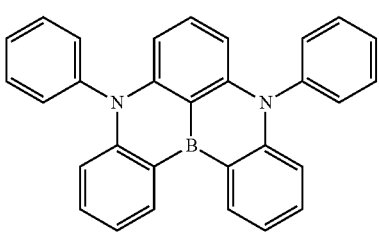

DABNA-1

-continued

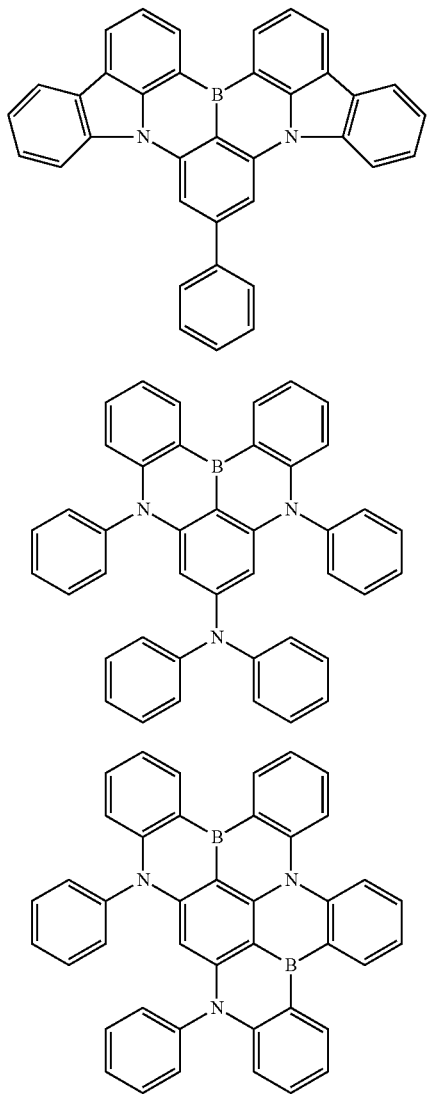

C1

C2

C3

The organic electroluminescence devices prepared according to the Examples and Comparative Examples were produced through a method described herein below.

ITO with a thickness of 1200 Å was patterned on a glass substrate, and cut into a size of 50 mm×50 mm×0.7 mm and ultrasonically washed with isopropyl alcohol and pure water for 5 minutes, respectively, and then washed by irradiation with ultraviolet rays and exposure to ozone for 30 minutes. Thereafter, NPD was deposited to have a thickness of 300 Å, TCTA was deposited to have a thickness of 200 Å, and CzSi was deposited to have a thickness of 100 Å to form a hole transport region.

Next, when the emission layer was formed, the polycyclic compound of Example or the compound of Comparative Example, and mCP were co-deposited at a ratio of 1:99 to form a layer having a thickness of 200 Å.

On the emission layer, a layer having a thickness of 200 Å was formed of TSPO1, and TPBI was deposited to have a thickness of 300 Å to form an electron transport region. Subsequently, LiF was deposited to have a thickness of 10 Å, and then a second electrode having a thickness of 3000 Å was formed of aluminum (Al).

In the Examples, the hole transport region, the emission layer, the electron transport region, and the second electrode were formed by using vacuum deposition apparatus.

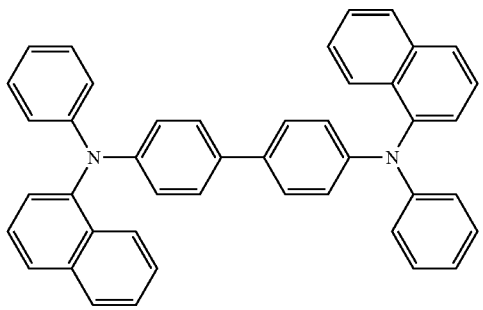

NPD

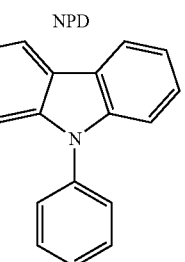

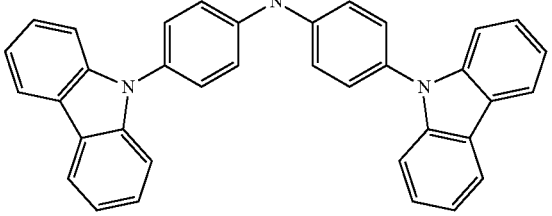

TCTA

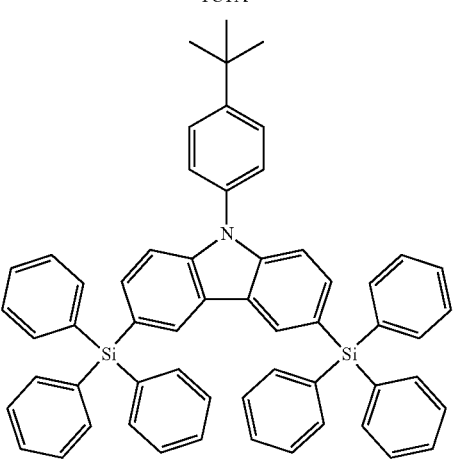

CzSi

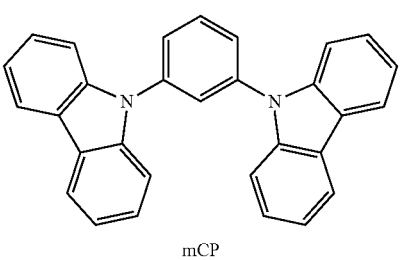

mCP

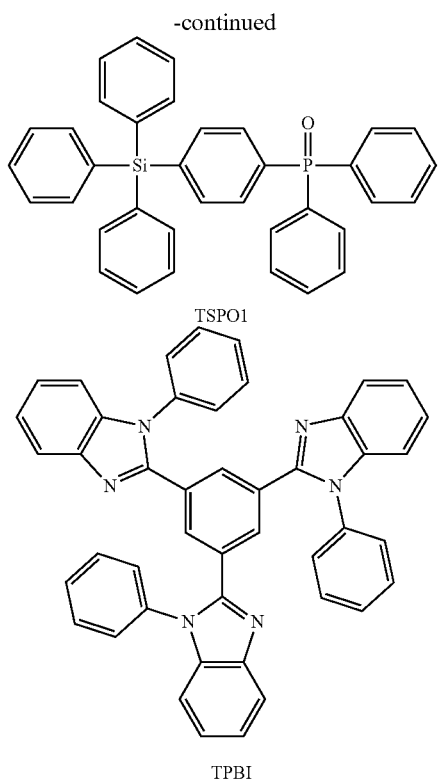

TSPO1

TPBI

Performance Evaluation of Device

Driving voltage, efficiency of the device, external quantum yield, and emission color were measured to evaluate the performance of the organic electroluminescence devices according to Examples and Comparative Examples.

TABLE 2

| Example of device production | Emission material | Driving voltage (V) | Efficiency (Cd/A) | Maximum external quantum yield (%) | Emission color |
|---|---|---|---|---|---|
| Example 1 | Example Compound 1 | 5.3 | 15.4 | 21 | blue |
| Example 2 | Example Compound 3 | 5.2 | 14.9 | 22 | blue |
| Example 3 | Example Compound 13 | 5.3 | 16.1 | 20 | blue |
| Example 4 | Example Compound 18 | 5.1 | 14.5 | 18 | blue |
| Example 5 | Example Compound 22 | 4.9 | 14.8 | 19 | blue |
| Example 6 | Example Compound 23 | 5.2 | 16.2 | 21 | blue |
| Example 7 | Example Compound 25 | 5.4 | 16.3 | 17 | blue |
| Comparative Example 1 | DABNA-1 | 5.5 | 13.3 | 15 | blue |
| Comparative Example 2 | Comparative Example Compound C1 | 5.6 | 12.8 | 16 | blue |
| Comparative Example 3 | Comparative Example Compound C2 | 5.4 | 13.4 | 15 | blue |
| Comparative Example 4 | Comparative Example Compound C3 | 5.5 | 13.2 | 16 | blue |

Referring to the results in Table 2, it can be seen that low driving voltage and high efficiency may be achieved when the polycyclic compound according to an embodiment of the present disclosure is used as a dopant material in the emission layer. For example, the driving voltages in Examples 1 to 7 were 4.9-5.4 V, and accordingly, a low driving voltage was achieved. However, the driving voltages in Comparative Examples 1 to 4 were 5.4-5.6 V, which represents overall higher driving voltage characteristics than the Examples.

In addition, Examples 1 to 7 represent the current efficiencies of 14.5-16.3 Cd/A and external quantum efficiencies of 17-21%, and accordingly, high efficiency was achieved. However, Comparative Examples 1 to 4 represent the current efficiencies of 12.9-13.5 Cd/A and external quantum efficiencies of 15-16%, which represents lower efficiency than the Examples.

In the polycyclic compound according to an embodiment, at least one selected from $Y_1$ to $Y_{20}$ in Formula 1 is N. Accordingly, while the present disclosure is not limited by any particular mechanism or theory, it is believed that the polycyclic compound has the excellent electron transport property as compared with Comparative Example Compounds, and the difference (hereinafter, referred to as $\Delta E_{ST}$) value between the lowest singlet energy level and lowest triplet energy level is smaller than that of Comparative Example Compounds. Additionally, the $\Delta E_{ST}$ value of the polycyclic compound of an embodiment may be, for example, 0.1 eV or less.

While the present disclosure is not limited by any particular mechanism or theory, it is believed that the low driving voltage is achieved due to the excellent electron transport property of the polycyclic compound in an embodiment. In addition, it is believed that because the life-time of the triplet exciton is short, the polycyclic compound of an embodiment has less possibility to cause triplet-triplet annihilation (TTA) phenomenon when the device is driven, and accordingly the efficiency with which the energy of the exciton is converted into light energy is increased, thereby improving the luminous efficiency.

The polycyclic compound according to an embodiment of the present disclosure may be used in the organic electroluminescence device to improve the life-time and efficiency of the device.

The organic electroluminescence device according to an embodiment of the present disclosure may achieve the high efficiency and long life-time.

An organic electroluminescence device according to an embodiment of the present disclosure may obtain high efficiency and long life-time.

A polycyclic compound device according to an embodiment of the present disclosure may improve life-time and efficiency of a device.

As used herein, the term "and/or" includes any and all combinations of one or more of the associated listed items. Expressions such as "at least one of," when preceding a list of elements, modify the entire list of elements and do not modify the individual elements of the list.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the subject matter of the present disclosure has been described in connection with certain embodiments, it is to be understood that the subject matter of the present disclosure is not limited to the disclosed embodiments, but, on the contrary, the present disclosure is intended to cover various modifications and equivalent arrangements included within the spirit and scope of the appended claims, and equivalents thereof.

What is claimed is:

1. An organic electroluminescence device comprising:
   a first electrode;
   a hole transport region on the first electrode;
   an emission layer on the hole transport region;
   an electron transport region on the emission layer; and
   a second electrode on the electron transport region,
   wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof, and
   wherein the emission layer includes a polycyclic compound represented by Formula 1:

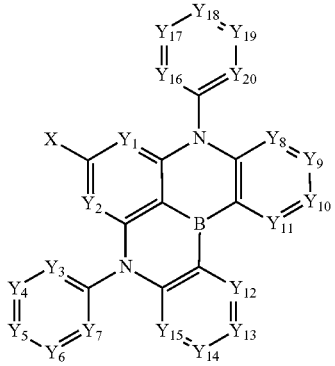

Formula 1 in Formula 1,
X is a substituted or unsubstituted amine group, a substituted or unsubstituted alkyl group having 1 to 10 carbon atoms, a substituted or unsubstituted cycloalkyl group having 5 to 30 ring-forming carbon atoms, a substituted or unsubstituted heterocycloalkyl group having 2 to 30 ring-forming carbon atoms, a substituted or unsubstituted aryl group having 6 to 30 ring-forming carbon atoms, or a substituted or unsubstituted heteroaryl group having 2 to 30 ring-forming carbon atoms, $Y_1$ to $Y_{20}$ are each independently $CR_1$ or N, wherein at least one selected from $Y_1$ to $Y_{20}$ is N, and $R_1$ is a hydrogen atom, a deuterium atom, a halogen atom, a boron group, a nitrile group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, wherein the polycyclic compound represented by Formula 1 is a thermally delayed fluorescence material, and wherein a difference $\Delta E_{ST}$ between a lowest singlet energy level and a lowest triplet energy level of the polycyclic compound represented by Formula 1 is 0.1 eV or less.

2. The organic electroluminescence device of claim 1, wherein the emission layer emits blue light.

3. The organic electroluminescence device of claim 1, wherein at least one selected from $Y_1$ to $Y_{15}$ is N.

4. The organic electroluminescence device of claim 1, wherein Formula 1 is represented by any one selected from Formulae 2-1 to 2-3:

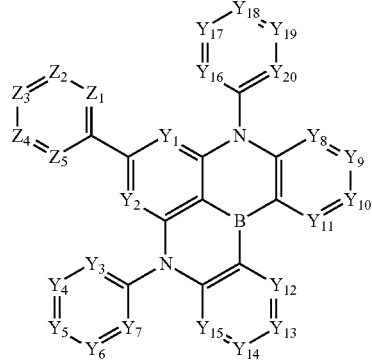

Formula 2-1

-continued

Formula 2-2

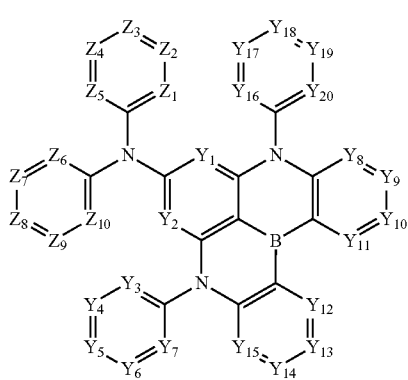

Formula 3-1

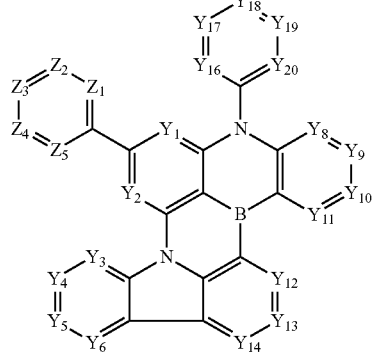

Formula 2-3

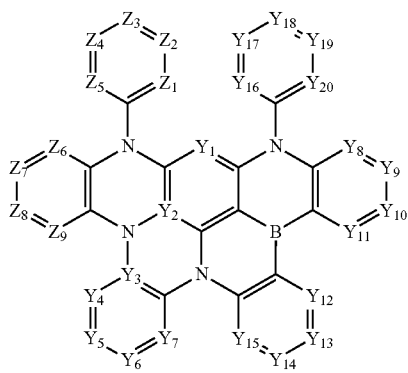

Formula 3-2

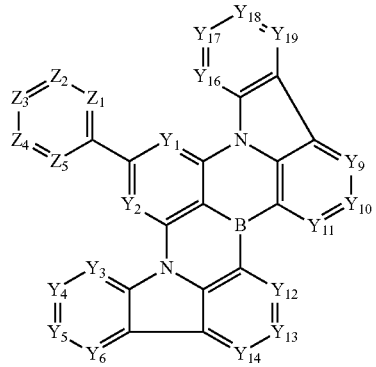

in Formulae 3-1 and 3-2,
$Y_1$ to $Y_6$, $Y_8$ to $Y_{14}$, $Y_{16}$ to $Y_{20}$, and $Z_1$ to $Z_5$ are the same as defined with respect to Formula 2-1.

8. The organic electroluminescence device of claim 4, wherein Formula 2-1 is represented by Formula 4:

Formula 4

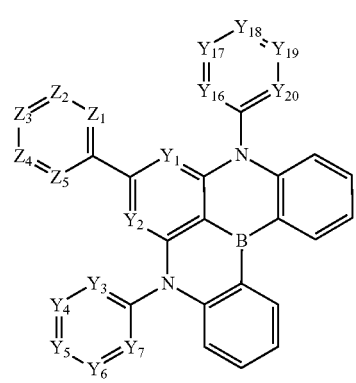

in Formula 4,
$Y_1$ to $Y_7$, $Y_{16}$ to $Y_{20}$, and $Z_1$ to $Z_5$ are the same as defined with respect to Formula 2-1.

9. The organic electroluminescence device of claim 4, wherein Formula 2-2 is represented by Formula 5:

in Formulae 2-1 to 2-3, $Z_1$ to $Z_{10}$ are each independently N or $CR_2$, wherein $R_2$ is a hydrogen atom, a deuterium atom, a halogen atom, a boron group, a nitrile group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, and $Y_1$ to $Y_{20}$ are the same as defined with respect to Formula 1.

5. The organic electroluminescence device of claim 4, wherein at least one selected from $Y_1$ and $Y_2$ in Formulae 2-1 and 2-2 is N.

6. The organic electroluminescence device of claim 4, wherein $Y_1$ in Formula 2-3 is N.

7. The organic electroluminescence device of claim 4, wherein Formula 2-1 is represented by Formula 3-1 or 3-2:

Formula 5

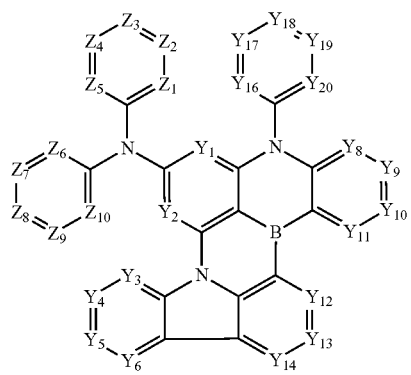

in Formula 5, $Y_1$ to $Y_6$, $Y_8$ to $Y_{14}$, $Y_{16}$ to $Y_{20}$, and $Z_1$ to $Z_{10}$ are the same as defined with respect to Formula 2-2.

10. The organic electroluminescence device of claim 4, wherein Formula 2-3 is represented by Formula 6:

Formula 6

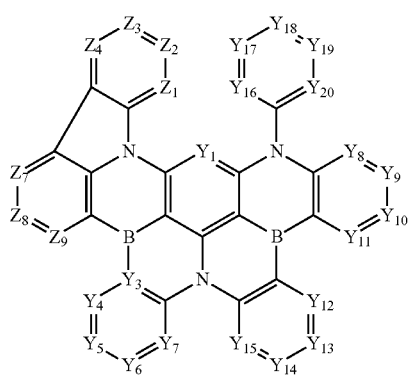

in Formula 6, $Y_1$, $Y_3$ to $Y_{20}$, $Z_1$ to $Z_4$, and $Z_7$ to $Z_9$ are the same as defined with respect to Formula 2-3.

11. The organic electroluminescence device of claim 1, wherein the polycyclic compound represented by Formula 1 is any one selected from compounds represented by Compound Group 1:

Compound Group 1

1

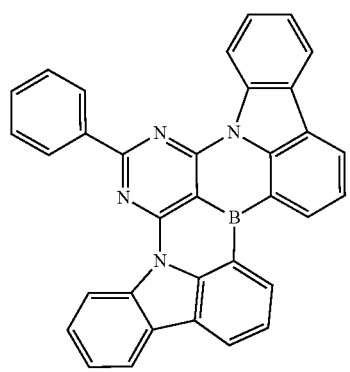

2

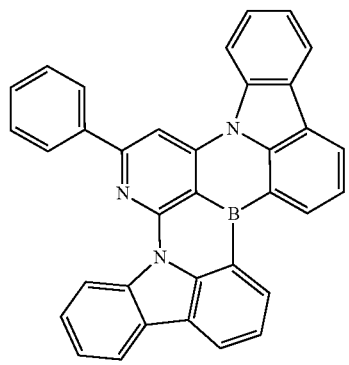

3

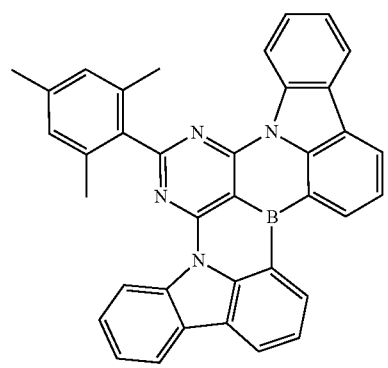

4

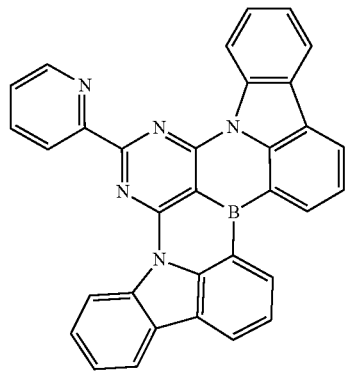

5

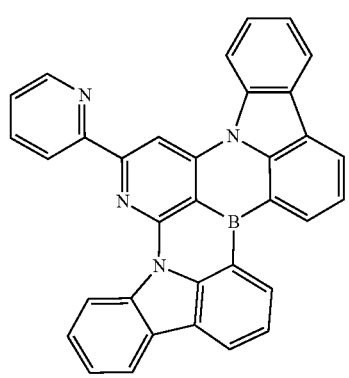

6
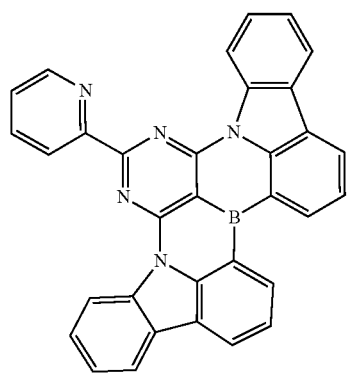
7
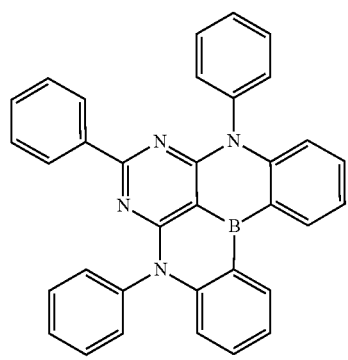
8
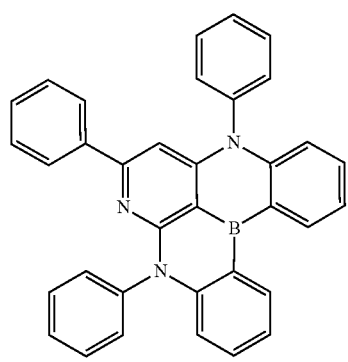
9
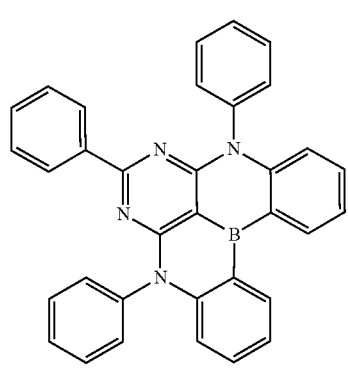
10
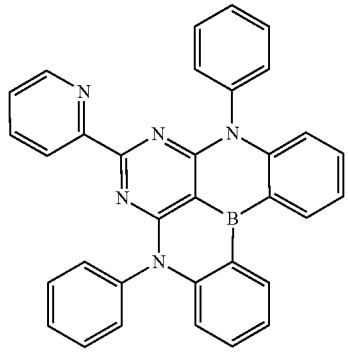
11
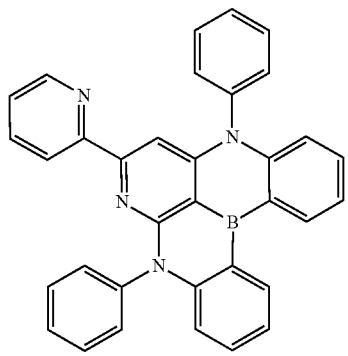
12
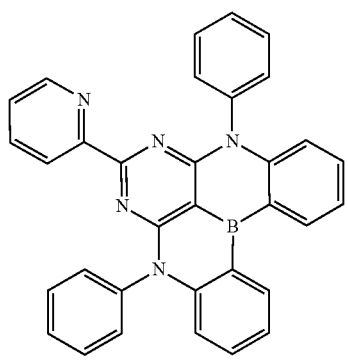
13
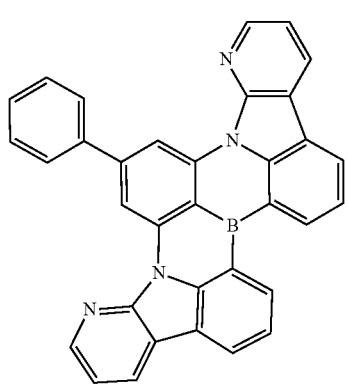

14
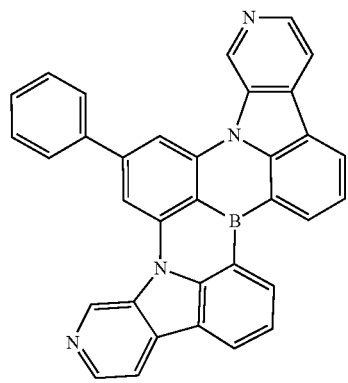
15
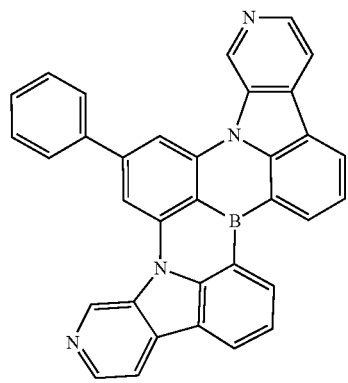
16
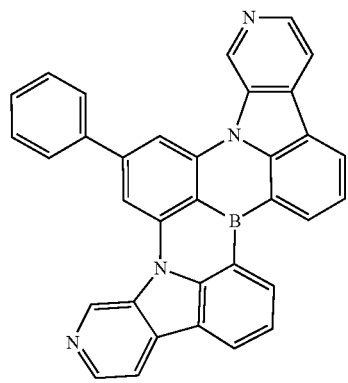
17
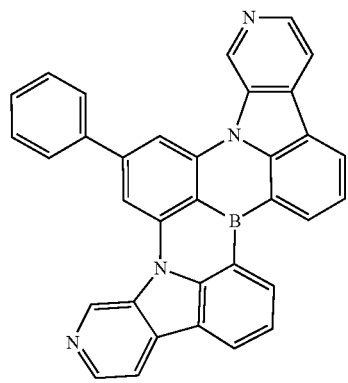
18
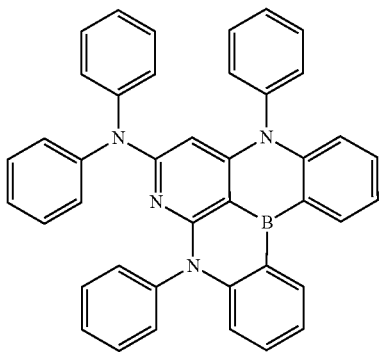
19
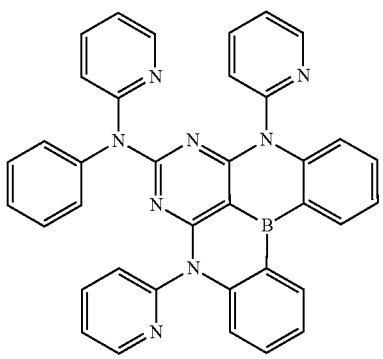
20
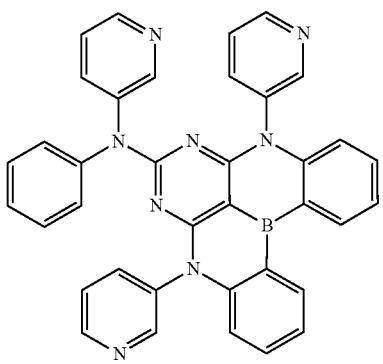
21
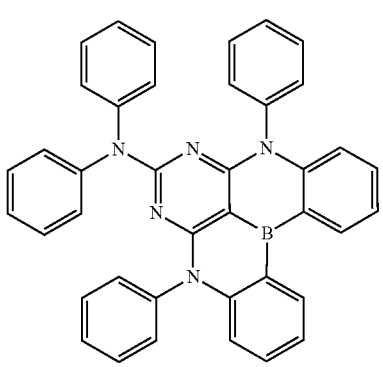

22
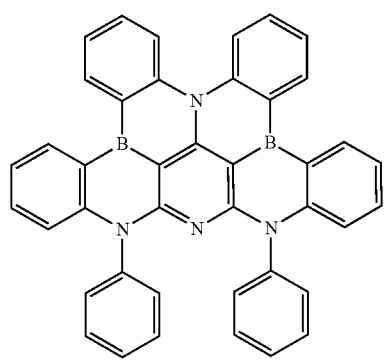
23
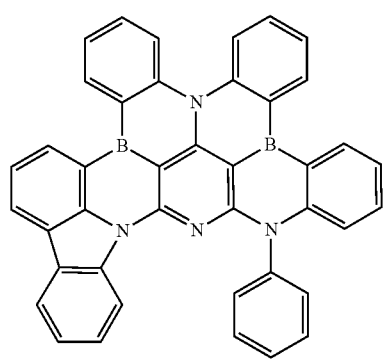
24
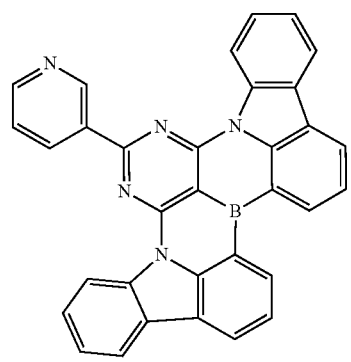
25
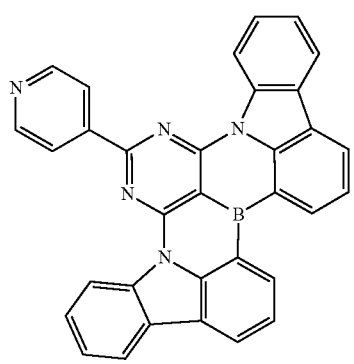
26
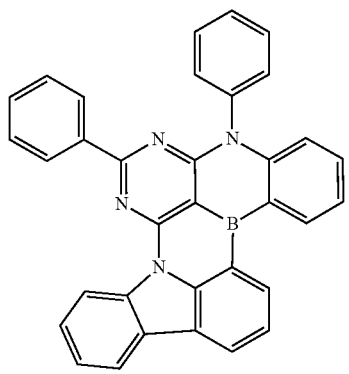
27
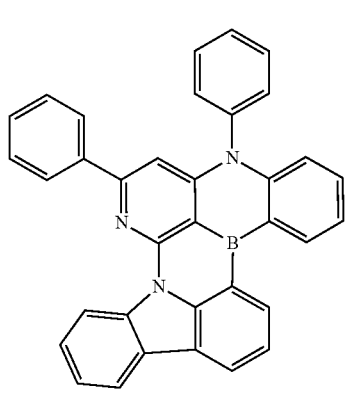
28
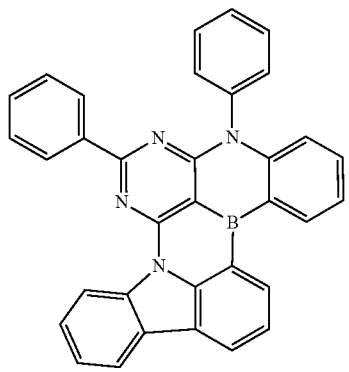
29
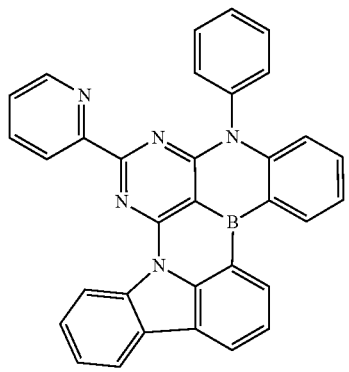

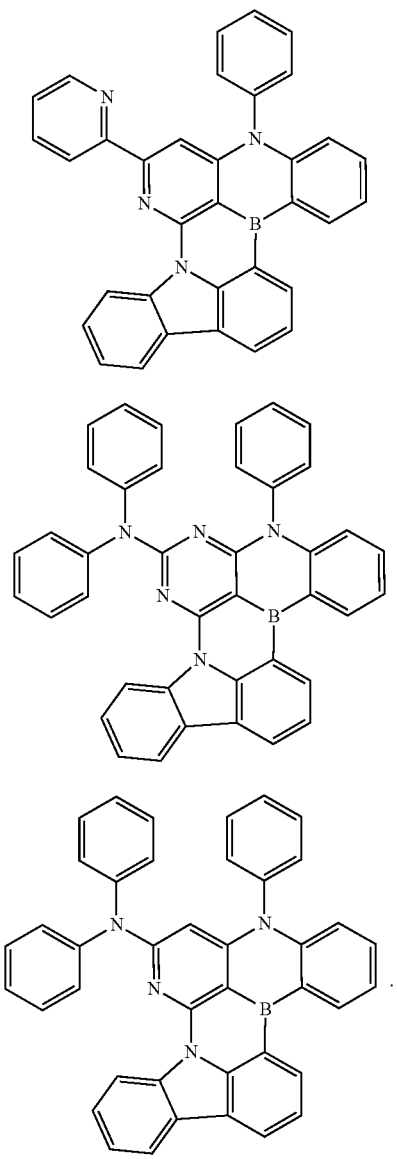

12. A polycyclic compound represented by Formula 1:

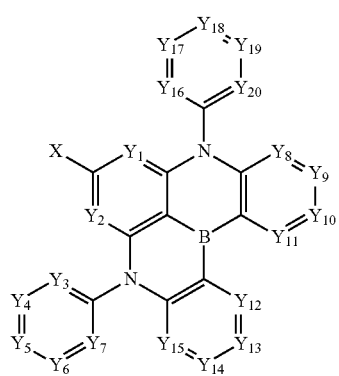

Formula 1 in Formula 1,

X is a substituted or unsubstituted amine group, a substituted or unsubstituted alkyl group having 1 to 10 carbon atoms, a substituted or unsubstituted cycloalkyl group having 5 to 30 ring-forming carbon atoms, a substituted or unsubstituted heterocycloalkyl group having 2 to 30 ring-forming carbon atoms, a substituted or unsubstituted aryl group having 6 to 30 ring-forming carbon atoms, or a substituted or unsubstituted heteroaryl group having 2 to 30 ring-forming carbon atoms, $Y_1$ to $Y_{20}$ are each independently $CR_1$ or N, wherein at least one selected from $Y_1$ to $Y_{20}$ is N, and $R_1$ is a hydrogen atom, a deuterium atom, a halogen atom, a boron group, a nitrile group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, wherein the polycyclic compound represented by Formula 1 is a thermally delayed fluorescence material, and wherein a difference $\Delta E_{ST}$ between a lowest singlet energy level and a lowest triplet energy level of the polycyclic compound represented by Formula 1 is 0.1 eV or less.

13. The polycyclic compound of claim 12, wherein Formula 1 is represented by any one selected from Formulae 2-1 to 2-3:

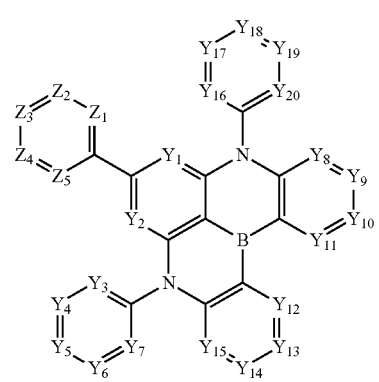

Formula 2-1

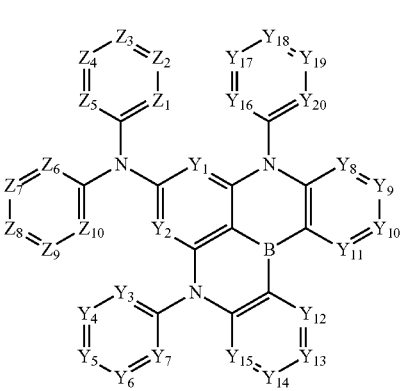

Formula 2-2

-continued

Formula 2-3

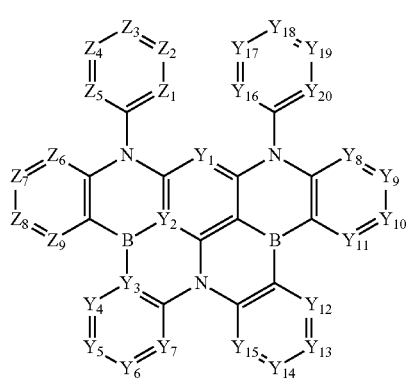

in Formulae 2-1 to 2-3,
$Z_1$ to $Z_{10}$ are each independently N or $CR_2$,
wherein $R_2$ is a hydrogen atom, a deuterium atom, a halogen atom, a boron group, a nitrile group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, and
$Y_1$ to $Y_{20}$ are the same as defined with respect to Formula 1.

14. The polycyclic compound of claim 13, wherein Formula 2-1 is represented by Formula 3-1 or 3-2:

Formula 3-1

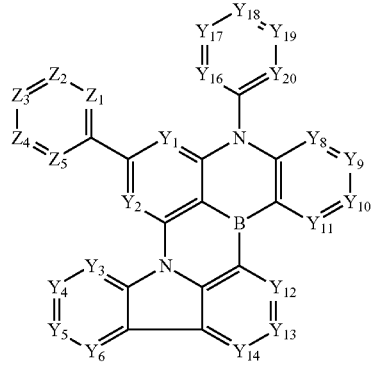

Formula 3-2

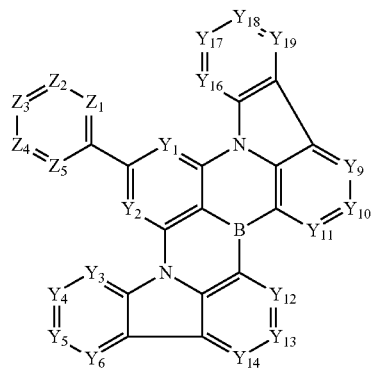

in Formulae 3-1 and 3-2,
$Y_1$ to $Y_6$, $Y_8$ to $Y_{14}$, $Y_{16}$ to $Y_{20}$, and $Z_1$ to $Z_5$ are the same as defined with respect to Formula 2-1.

15. The polycyclic compound of claim 13, wherein Formula 2-1 is represented by Formula 4:

Formula 4

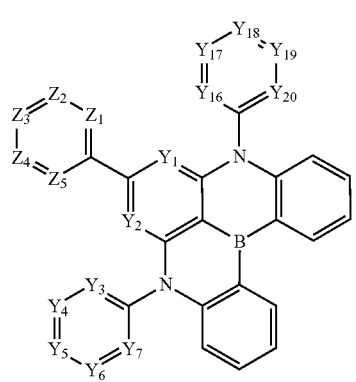

in Formula 4,
$Y_1$ to $Y_7$, $Y_{16}$ to $Y_{20}$, and $Z_1$ to $Z_5$ are the same as defined with respect to Formula 2-1.

16. The polycyclic compound of claim 13, wherein Formula 2-2 is represented by Formula 5:

Formula 5

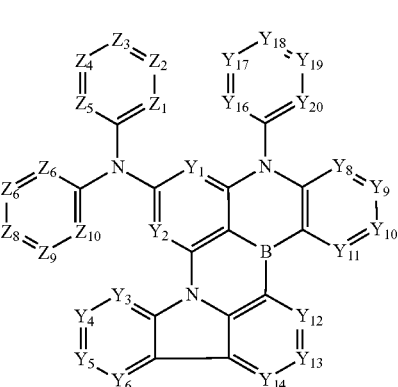

in Formula 5,
$Y_1$ to $Y_6$, $Y_8$ to $Y_{14}$, $Y_{16}$ to $Y_{20}$, and $Z_1$ to $Z_{10}$ are the same as defined with respect to Formula 2-2.

17. The polycyclic compound of claim 13, wherein Formula 2-3 is represented by Formula 6:

Formula 6

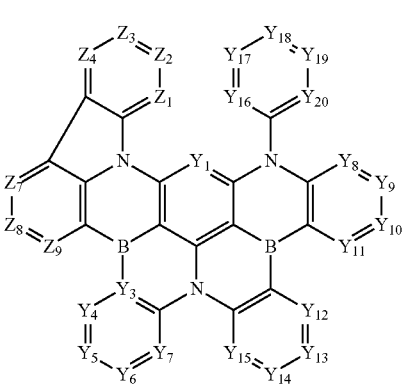

in Formula 6,
Y$_1$, Y$_3$ to Y$_{20}$, Z$_1$ to Z$_4$, and Z$_7$ to Z$_9$ are the same as defined with respect to Formula 2-3.
18. The polycyclic compound of claim 12, wherein the polycyclic compound represented by Formula 1 is any one selected from compounds represented by Compound Group 1:
Compound Group 1
1
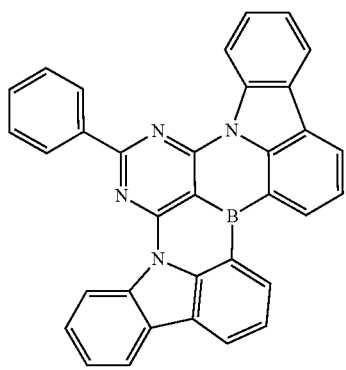
2
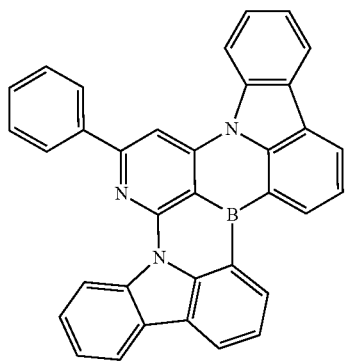
3
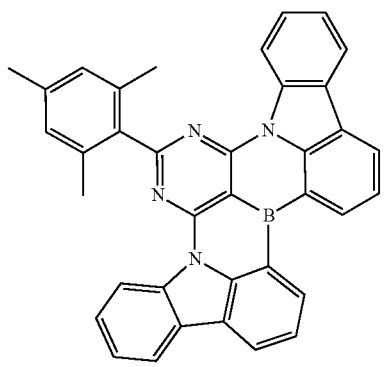
4
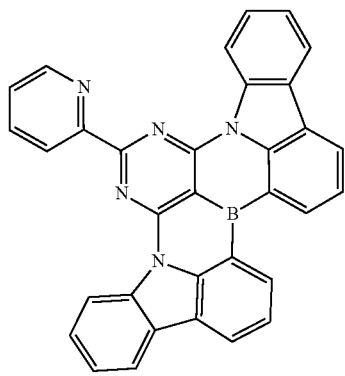
5
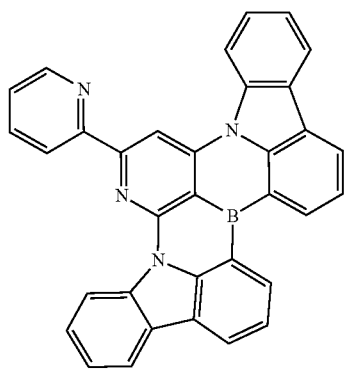
6
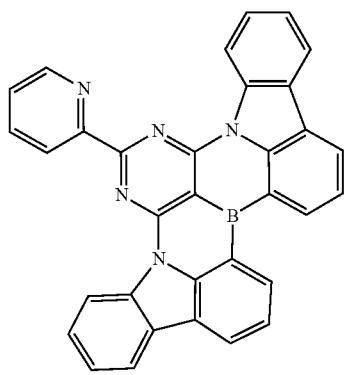
7
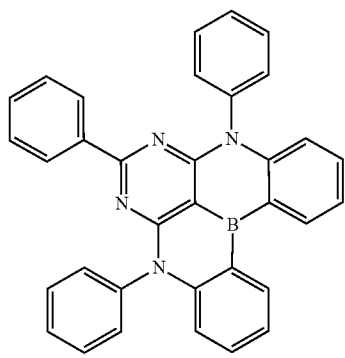

8
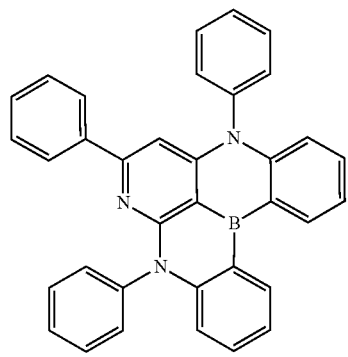
9
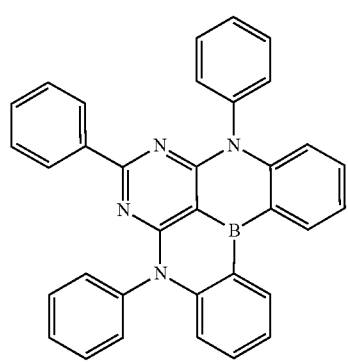
10
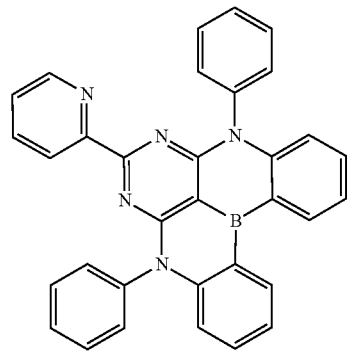
11
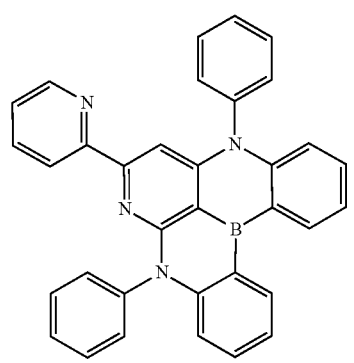
12
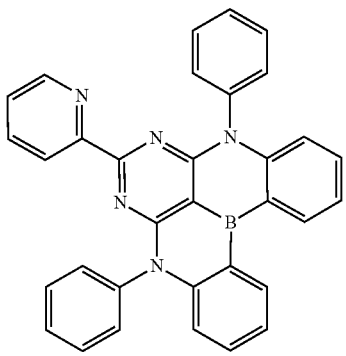
13
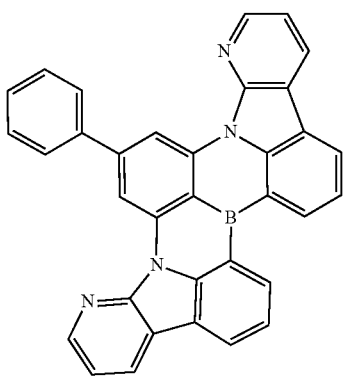
14
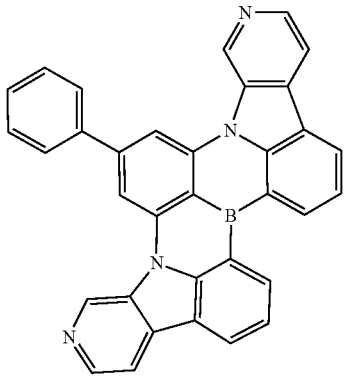
15
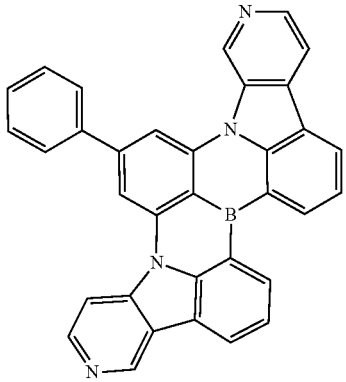

16
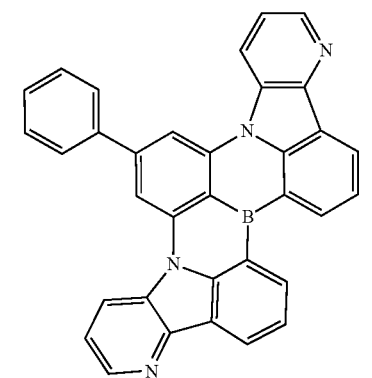
17
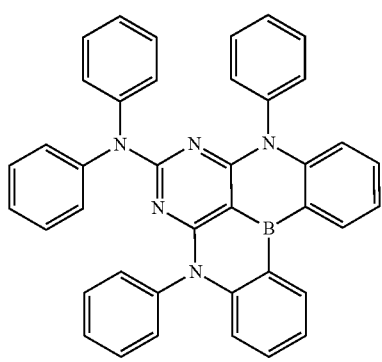
18
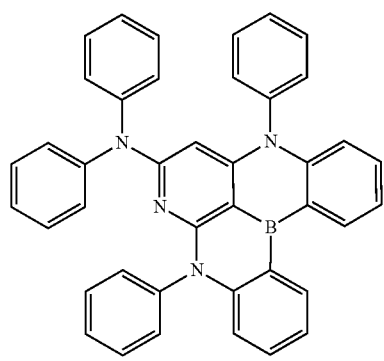
19
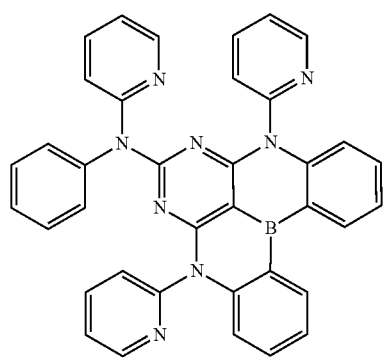
20
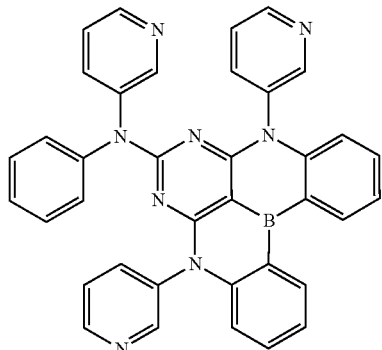
21
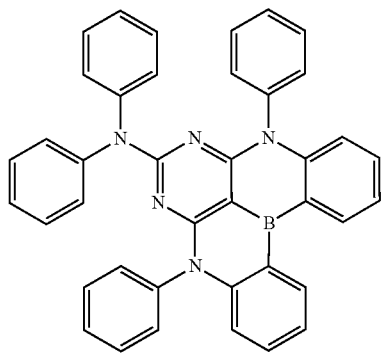
22
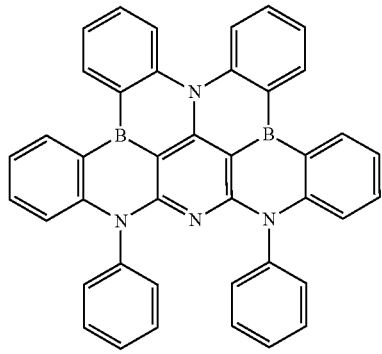
23
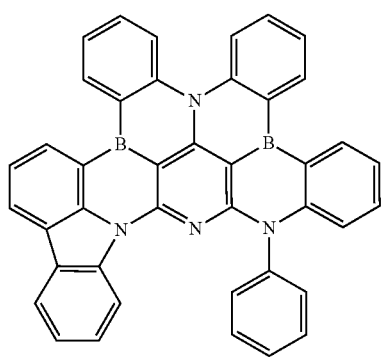

24
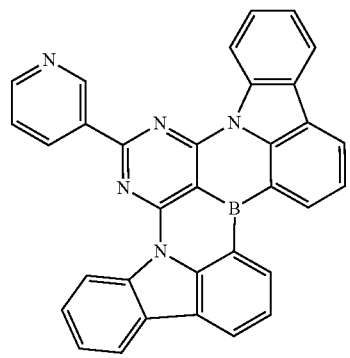
25
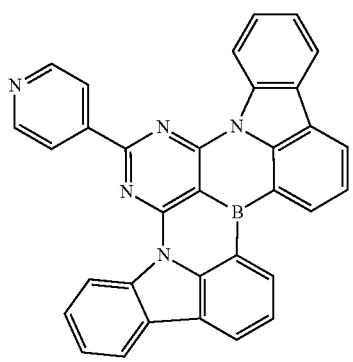
26
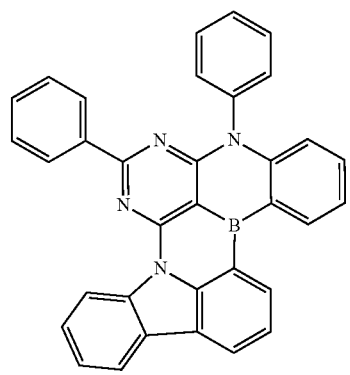
27
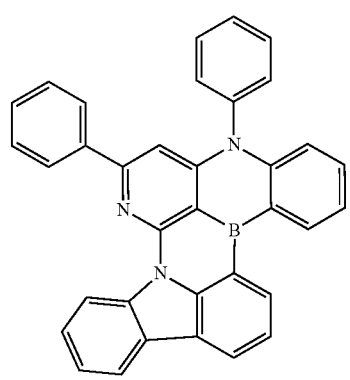
28
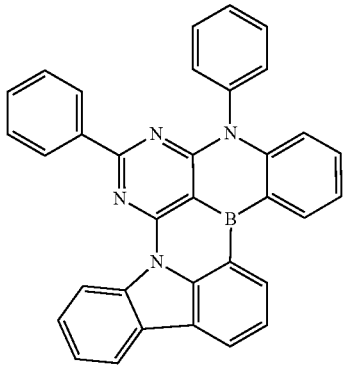
29
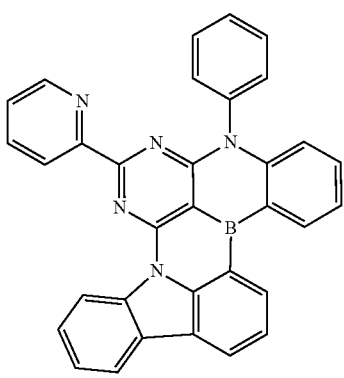
30
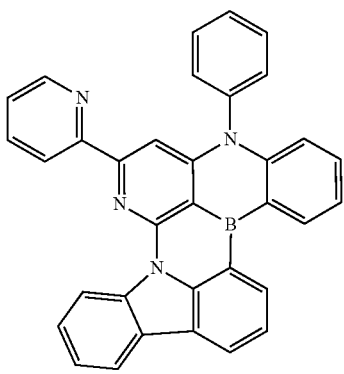
31
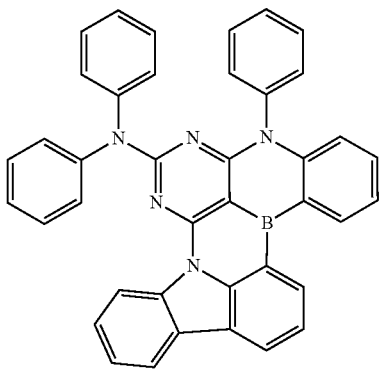

-continued

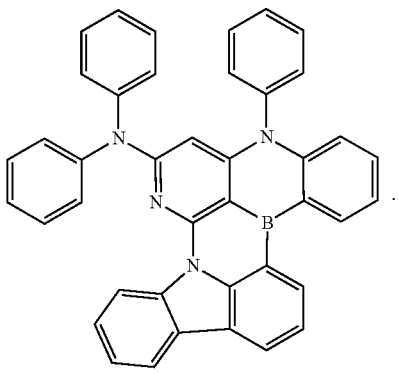

32

19. A display device including an organic electroluminescence device, wherein the organic electroluminescence device comprising:
- a first electrode;
- a hole transport region on the first electrode;
- an emission layer on the hole transport region;
- an electron transport region on the emission layer; and
- a second electrode on the electron transport region,
- wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof, and wherein the emission layer includes a polycyclic compound represented by Formula 1:

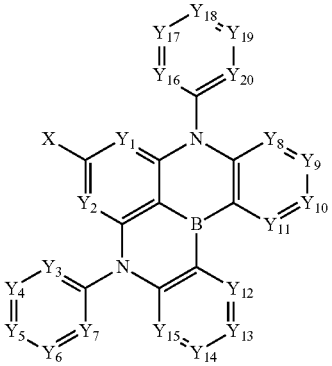

Formula 1 in Formula 1,
X is a substituted or unsubstituted amine group, a substituted or unsubstituted alkyl group having 1 to 10 carbon atoms, a substituted or unsubstituted cycloalkyl group having 5 to 30 ring-forming carbon atoms, a substituted or unsubstituted heterocycloalkyl group having 2 to 30 ring-forming carbon atoms, a substituted or unsubstituted aryl group having 6 to 30 ring-forming carbon atoms, or a substituted or unsubstituted heteroaryl group having 2 to 30 ring-forming carbon atoms, $Y_1$ to $Y_{20}$ are each independently $CR_1$ or N, wherein at least one selected from $Y_1$ to $Y_{20}$ is N, and $R_1$ is a hydrogen atom, a deuterium atom, a halogen atom, a boron group, a nitrile group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, wherein the polycyclic compound represented by Formula 1 is a thermally delayed fluorescence material, and wherein a difference $\Delta E_{st}$ between a lowest singlet energy level and a lowest triplet energy level of the polycyclic compound represented by Formula 1 is 0.1 eV or less.

* * * * *